US010469203B2

(12) United States Patent
Sankar et al.

(10) Patent No.: US 10,469,203 B2
(45) Date of Patent: Nov. 5, 2019

(54) ON-DEMAND TIME-INTERLEAVING

(71) Applicant: QUALCOMM Incorporated, San Diego, CA (US)

(72) Inventors: Hari Sankar, San Diego, CA (US); Jae Won Yoo, San Diego, CA (US); June Namgoong, San Diego, CA (US); Alexei Yurievitch Gorokhov, San Diego, CA (US); Jing Jiang, San Diego, CA (US); Joseph Binamira Soriaga, San Diego, CA (US); Brian Banister, San Diego, CA (US); Thomas Wilborn, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/672,618

(22) Filed: Aug. 9, 2017

(65) Prior Publication Data

US 2018/0131467 A1 May 10, 2018

Related U.S. Application Data

(60) Provisional application No. 62/417,936, filed on Nov. 4, 2016.

(51) Int. Cl.
*H04L 1/00* (2006.01)
*H03M 13/00* (2006.01)
*H03M 13/27* (2006.01)

(52) U.S. Cl.
CPC ...... *H04L 1/0071* (2013.01); *H03M 13/6525* (2013.01); *H03M 13/6558* (2013.01); *H04L 1/0009* (2013.01); *H03M 13/27* (2013.01)

(58) Field of Classification Search
CPC . H04L 1/0071; H04L 5/0007; H04L 27/2626; H04W 84/12; H04W 88/08
(Continued)

(56) References Cited

U.S. PATENT DOCUMENTS

2005/0030887 A1 2/2005 Jacobsen et al.
2006/0041818 A1 2/2006 Rao
(Continued)

FOREIGN PATENT DOCUMENTS

EP 0727891 A2 8/1996
WO WO-2014088195 A1 6/2014
WO WO-2016128728 A2 8/2016

OTHER PUBLICATIONS

ISA/EPO, Partial International Search Report of the International Searching Authority, Int'l. App. No. PCT/US2017/058289, dated Feb. 5, 2018, European Patent Office, Rijswijk, NL, 17 pgs.
(Continued)

*Primary Examiner* — Sam Bhattacharya
(74) *Attorney, Agent, or Firm* — Holland & Hart LLP

(57) ABSTRACT

Methods, systems, and devices for wireless communication between a first wireless device and a second wireless device are described. A second wireless device may determine that a channel condition satisfies at least one channel condition threshold. The second wireless device may identify, based on the determination, a time-interleaved transmission scheme for block(s) of encoded information. The second wireless device may transmit the block(s) of encoded information to a first wireless device in accordance with at least the time-interleaved transmission scheme. In some instances, the first wireless device may determine that the channel condition satisfies the at least one channel condition threshold and send a message to the second wireless device in order to trigger the use of the time-interleaved transmission scheme.

28 Claims, 14 Drawing Sheets

(58) Field of Classification Search
USPC ............... 455/403, 464; 370/208, 329, 330; 375/133, 340, 342
See application file for complete search history.

(56) References Cited

U.S. PATENT DOCUMENTS

| | | | |
|---|---|---|---|
| 2009/0177943 A1* | 7/2009 | Silvus ................ | G11B 20/1496 714/755 |
| 2009/0252248 A1* | 10/2009 | Ghosh .................. | H04L 1/0071 375/267 |
| 2014/0153523 A1 | 6/2014 | Parantainen | |
| 2016/0205677 A1 | 7/2016 | Kim et al. | |

OTHER PUBLICATIONS

International Search Report and Written Opinion—PCT/US2017/058289—ISA/EPO—dated Apr. 5, 2018.

* cited by examiner

ON-DEMAND TIME-INTERLEAVING

CROSS REFERENCES

The present Application for patent claims priority to U.S. Provisional Patent Application No. 62/417,936 by SANKAR, et al., entitled "ON-DEMAND TIME-INTERLEAVING," filed Nov. 4, 2016, assigned to the assignee hereof.

BACKGROUND

The following relates generally to wireless communication, and more specifically to on-demand time-interleaving.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system). A wireless multiple-access communications system may include a number of base stations or access network nodes, each simultaneously supporting communication for multiple communication devices, which may be otherwise known as user equipment (UE).

Wireless communications may include transmission of pilot signals that are conventionally within a symbol period, such as one OFDMA symbol period or a group of OFDMA symbol periods, of a subframe. For example, in some systems, pilot signals may be transmitted in the leading and trailing ends of a subframe. The reception of the pilot signals at a receiving device may support various channel estimation techniques. These channel estimation techniques, however, may result in incorrect channel estimations for the symbol periods within the subframe (e.g., the symbol periods that are relatively distant from the pilot signals). In instances where the channel conditions indicate high Doppler or fading, the channel estimation errors may result in significant differences between the expected channel conditions and the actual channel conditions. Moreover, transmission of information, such as code blocks of information, within a single symbol may result in significant detection difficulties during symbol periods associated with higher estimation errors.

SUMMARY

The described techniques relate to improved methods, systems, devices, or apparatuses that support on-demand time-interleaving. Generally, the described techniques provide for a base station and/or a user equipment (UE) to use at least a time-interleaved transmission scheme for transmission of information. For example, a first wireless device, which may be either a base station or a UE, may determine that the actual or monitored channel conditions have reached a threshold, (e.g., Doppler, fading, signal-to-interference plus noise ratio (SINR), etc.). Based on this, the first wireless device may transmit a message to a second wireless device, which, when the first wireless device is a UE, the second wireless device may be a base station, or alternatively, when the first wireless device is a base station, the second wireless device may be a UE. The message from the first wireless device to the second wireless device may include a request for the second wireless device to use a time-interleaved transmission scheme. The time-interleaved transmission scheme may include transmission of block(s) of encoded information across multiple symbol periods, (e.g., within the same slot and/or across multiple slots). The time-interleaved transmission scheme may also include, in some examples, interleaving the block(s) of encoded information across different frequencies or subcarriers of the slot(s). The time-interleaved transmission scheme may include transmission of pilot signals using a dense pilot signal configuration that includes pilot signals transmitted in multiple symbols of the slot(s). Thus, the first wireless device may receive the block(s) of encoded information from the second wireless device according to the time-interleaved transmission scheme. The first wireless device may de-interleave the received information.

In some aspects, the second wireless device may autonomously determine that the channel conditions have reached a threshold and employ the time-interleaved transmission scheme. For example, the second wireless device may determine that a channel condition has satisfied the threshold, for example, based on monitoring channel conditions, based on feedback reports from other wireless devices (e.g., UEs or base stations), inter-device communication (such as inter base station communications or communications between a small cell and a base station), etc. The second wireless device may identify the time-interleaved transmission scheme to use for the transmission of the block(s) of encoded information. The second wireless device may then use the time-interleaved transmission scheme to transmit the block(s) of encoded information to the first wireless device.

A method of wireless communication is described. The method may include determining, at a first wireless device, that a channel condition satisfies at least one channel condition threshold, transmitting, based at least in part on the channel condition satisfying the at least one channel condition threshold, a message to a second wireless device, the message comprising a request for a time-interleaved transmission scheme for one or more blocks of encoded information, and receiving the one or more blocks of encoded information from the second wireless device in accordance with at least the time-interleaved transmission scheme.

An apparatus for wireless communication is described. The apparatus may include means for determining, at a first wireless device, that a channel condition satisfies at least one channel condition threshold, means for transmitting, based at least in part on the channel condition satisfying the at least one channel condition threshold, a message to a second wireless device, the message comprising a request for a time-interleaved transmission scheme for one or more blocks of encoded information, and means for receiving the one or more blocks of encoded information from the second wireless device in accordance with at least the time-interleaved transmission scheme.

Another apparatus for wireless communication is described. The apparatus may include a processor, memory in electronic communication with the processor, and instructions stored in the memory. The instructions may be operable to cause the processor to determine, at a first wireless device, that a channel condition satisfies at least one channel condition threshold, transmit, based at least in part on the channel condition satisfying the at least one channel condition threshold, a message to a second wireless device, the message comprising a request for a time-interleaved transmission scheme for one or more blocks of encoded information, and receive the one or more blocks of encoded information from the second wireless device in accordance with at least the time-interleaved transmission scheme.

A non-transitory computer readable medium for wireless communication is described. The non-transitory computer-readable medium may include instructions operable to cause a processor to determine, at a first wireless device, that a channel condition satisfies at least one channel condition threshold, transmit, based at least in part on the channel condition satisfying the at least one channel condition threshold, a message to a second wireless device, the message comprising a request for a time-interleaved transmission scheme for one or more blocks of encoded information, and receive the one or more blocks of encoded information from the second wireless device in accordance with at least the time-interleaved transmission scheme.

Some examples of the method, apparatus, and non-transitory computer-readable medium described above may further include processes, features, means, or instructions for receiving, in accordance with at least the time-interleaved transmission scheme, different portions of the one or more blocks of encoded information during a plurality of symbol periods.

Some examples of the method, apparatus, and non-transitory computer-readable medium described above may further include processes, features, means, or instructions for receiving, in accordance with at least the time-interleaved transmission scheme, different portions of the one or more blocks of encoded information during a same symbol period.

Some examples of the method, apparatus, and non-transitory computer-readable medium described above may further include processes, features, means, or instructions for receiving, in accordance with at least the time-interleaved transmission scheme, a plurality of pilot signals during a plurality of symbol periods.

In some examples of the method, apparatus, and non-transitory computer-readable medium described above, the time-interleaved transmission scheme comprises a decreased pilot signal density pattern.

Some examples of the method, apparatus, and non-transitory computer-readable medium described above may further include processes, features, means, or instructions for applying a channel estimation value to different portions of the one or more blocks of encoded information that may be received during a plurality of different symbol periods.

Some examples of the method, apparatus, and non-transitory computer-readable medium described above may further include processes, features, means, or instructions for performing a channel estimation procedure based at least in part on the plurality of pilot signals.

Some examples of the method, apparatus, and non-transitory computer-readable medium described above may further include processes, features, means, or instructions for determining that a Doppler parameter associated with a channel may be above the at least one channel condition threshold, wherein the channel condition comprises the Doppler parameter.

Some examples of the method, apparatus, and non-transitory computer-readable medium described above may further include processes, features, means, or instructions for determining that an interference level for a channel may be above the at least one channel condition threshold, wherein the channel condition comprises the interference level.

Some examples of the method, apparatus, and non-transitory computer-readable medium described above may further include processes, features, means, or instructions for determining that a fading parameter associated with a channel may be above the at least one channel condition threshold, wherein the channel condition comprises the fading parameter.

In some examples of the method, apparatus, and non-transitory computer-readable medium described above, the first wireless device may be a UE while the second wireless device may be a base station. In other examples of the method, apparatus, and non-transitory computer-readable medium described above, the first wireless device may be a base station while the second wireless device may be a UE.

A method of wireless communication is described. The method may include determining that a channel condition satisfies at least one channel condition threshold, identifying, based at least in part on the channel condition satisfying the at least one channel condition threshold, a time-interleaved transmission scheme for one or more blocks of encoded information, and transmitting the one or more blocks of encoded information in accordance with at least the time-interleaved transmission scheme.

An apparatus for wireless communication is described. The apparatus may include means for determining that a channel condition satisfies at least one channel condition threshold, means for identifying, based at least in part on the channel condition satisfying the at least one channel condition threshold, a time-interleaved transmission scheme for one or more blocks of encoded information, and means for transmitting the one or more blocks of encoded information in accordance with at least the time-interleaved transmission scheme.

Another apparatus for wireless communication is described. The apparatus may include a processor, memory in electronic communication with the processor, and instructions stored in the memory. The instructions may be operable to cause the processor to determine that a channel condition satisfies at least one channel condition threshold, identify, based at least in part on the channel condition satisfying the at least one channel condition threshold, a time-interleaved transmission scheme for one or more blocks of encoded information, and transmit the one or more blocks of encoded information in accordance with at least the time-interleaved transmission scheme.

A non-transitory computer readable medium for wireless communication is described. The non-transitory computer-readable medium may include instructions operable to cause a processor to determine that a channel condition satisfies at least one channel condition threshold, identify, based at least in part on the channel condition satisfying the at least one channel condition threshold, a time-interleaved transmission scheme for one or more blocks of encoded information, and transmit the one or more blocks of encoded information in accordance with at least the time-interleaved transmission scheme.

Some examples of the method, apparatus, and non-transitory computer-readable medium described above may further include processes, features, means, or instructions for transmitting, in accordance with at least the time-interleaved transmission scheme, different portions of the one or more blocks of encoded information during a plurality of symbol periods.

Some examples of the method, apparatus, and non-transitory computer-readable medium described above may further include processes, features, means, or instructions for transmitting, in accordance with at least the time-interleaved transmission scheme, different portions of the one or more blocks of encoded information during a same symbol period.

Some examples of the method, apparatus, and non-transitory computer-readable medium described above may further include processes, features, means, or instructions for transmitting, in accordance with at least the time-interleaved transmission scheme, a plurality of pilot signals during a plurality of symbol periods.

In some examples of the method, apparatus, and non-transitory computer-readable medium described above, the time-interleaved transmission scheme comprises a decreased pilot signal density pattern.

Some examples of the method, apparatus, and non-transitory computer-readable medium described above may further include processes, features, means, or instructions for determining that a Doppler parameter associated with a channel may be above the at least one channel condition threshold, wherein the channel condition comprises the Doppler parameter.

Some examples of the method, apparatus, and non-transitory computer-readable medium described above may further include processes, features, means, or instructions for determining that an interference level for a channel may be above the at least one channel condition threshold, wherein the channel condition comprises the interference level.

Some examples of the method, apparatus, and non-transitory computer-readable medium described above may further include processes, features, means, or instructions for determining that a fading parameter associated with a channel may be above the at least one channel condition threshold, wherein the channel condition comprises the fading parameter.

Some examples of the method, apparatus, and non-transitory computer-readable medium described above may further include processes, features, means, or instructions for receiving a message comprising a request for a time-interleaved transmission scheme for one or more blocks of encoded information.

DETAILED DESCRIPTION

Figure 1:
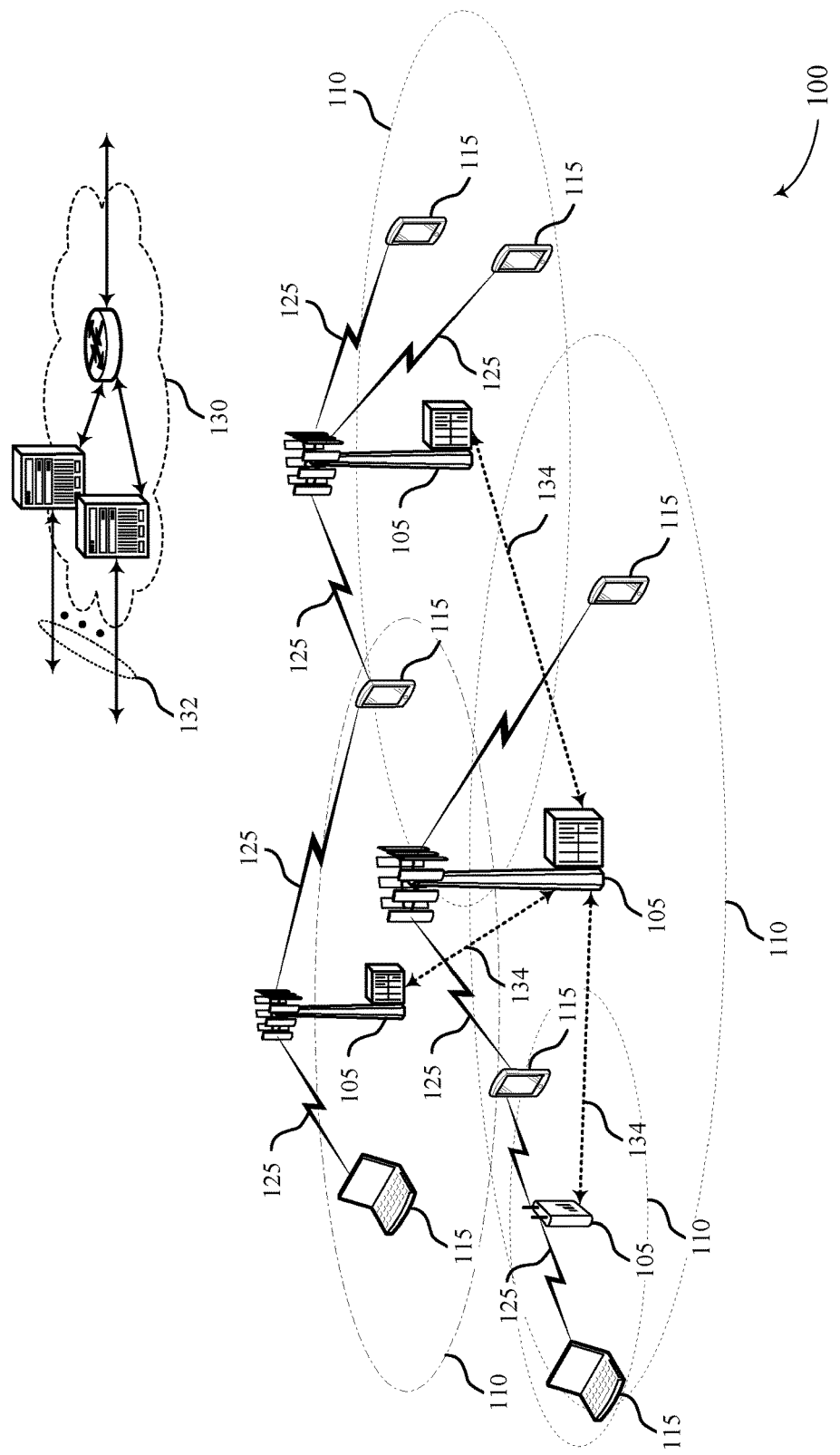
FIG. 1 illustrates an example of a system for wireless communication that supports on-demand time-interleaving in accordance with aspects of the present disclosure.

Certain wireless communication systems, such as Long Term Evolution (LTE) (or LTE-Advanced (LTE-A)) or a New Radio (NR) network, may utilize a self-contained slot (SC-S) structure where a user equipment (UE) provides the acknowledgement/negative-acknowledgement (ACK/NACK) feedback within the same slot. Such wireless communication systems may also utilize a non-self-contained slot (NSC-S) structure where the UE provides the ACK/NACK feedback in a subsequent slot. For example, a wireless communication system may utilize a NSC-S structure when a high Doppler scenario has been observed. Other considerations may be used to determine whether the SC-S structure and/or the NSC-S structure is used. The described techniques are applicable to either or both of the SC-S structure and the NSC-S structure.

Aspects of the disclosure are initially described in the context of a wireless communications system. Broadly, the described techniques provide for use of a time-interleaved transmission scheme for transmission of block(s) of encoded information, for example, code block(s) (CB(s)). The described time-interleaved transmission scheme may be implemented autonomously by a wireless device (such as a UE or a base station) and/or may be implemented at the request of a wireless device (such as a UE or a base station). For example, a UE may monitor certain channel conditions and determine that the channel conditions have reached or otherwise satisfied a threshold. The UE may transmit a message to the base station requesting implementation of the time-interleaved transmission scheme and then receive the blocks of encoded information according to the time-interleaved transmission scheme. Alternatively, a base station may monitor certain channel conditions and determine that the channel conditions have reached or otherwise satisfied a threshold, and thus may transmit a message to a UE requesting implementation of the time-interleaved transmission scheme and then receive the blocks of encoded information according to the time-interleaved transmission scheme.

In some aspects, the base station or UE may identify and implement the time-interleaved transmission scheme without receiving the request message from another wireless device. For example, the base station may determine that the channel condition has reached a threshold and identify the time-interleaved transmissions scheme based on the determination. As another example, the UE may determine that the channel condition has reached a threshold and identify the time-interleaved transmissions scheme based on the determination. In either case, the presence of a time-interleaver may be signaled to a receiving wireless device via a control channel. The time-interleaved transmission scheme may include transmitting block(s) (or portions of a block) of encoded information during different symbol periods of the same slot and/or across multiple slots. In some cases, a symbol period may be defined by one orthogonal frequency division multiple access (OFDMA) symbol period. In other cases, a symbol period may be defined by a group of OFDMA symbol periods. The time-interleaved transmission scheme may also include transmitting the block(s) (or portions of a block) of encoded information using different subcarriers.

Aspects of the disclosure are further illustrated by and described with reference to apparatus diagrams, system diagrams, and flowcharts that relate to on-demand time-interleaving.

FIG. 1 illustrates an example of a wireless communications system 100 in accordance with various aspects of the present disclosure. The wireless communications system 100 includes base stations 105, UEs 115, and a core network 130. In some examples, the wireless communications system 100 may be an LTE (or LTE-A) network, or a NR network. In some cases, wireless communications system 100 may support enhanced broadband communications, ultra-reliable (i.e., mission critical) communications, low latency communications, and communications with low-cost and low-complexity devices.

Base stations 105 may wirelessly communicate with UEs 115 via one or more base station antennas. Each base station 105 may provide communication coverage for a respective geographic coverage area 110. Communication links 125 shown in wireless communications system 100 may include uplink (UL) transmissions from a UE 115 to a base station 105, or downlink (DL) transmissions, from a base station 105 to a UE 115. Control information and data may be multiplexed on an uplink channel or downlink according to various techniques. Control information and data may be multiplexed on a downlink channel, for example, using time division multiplexing (TDM) techniques, frequency division multiplexing (FDM) techniques, or hybrid TDM-FDM techniques. In some examples, the control information transmitted during a transmission time interval (TTI) of a downlink channel may be distributed between different control regions in a cascaded manner (e.g., between a common control region and one or more UE-specific control regions).

UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of things (IoT) device, an Internet of Everything (IoE) device, a machine type communication (MTC) device, an appliance, an automobile, or the like.

In some cases, a UE 115 may also be able to communicate directly with other UEs (e.g., using a peer-to-peer (P2P) or device-to-device (D2D) protocol). One or more of a group of UEs 115 utilizing D2D communications may be within the coverage area 110 of a cell. Other UEs 115 in such a group may be outside the coverage area 110 of a cell, or otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out independent of a base station 105.

Some UEs 115, such as MTC or IoT devices, may be low cost or low complexity devices, and may provide for automated communication between machines, (i.e., Machine-to-Machine (M2M) communication). M2M or MTC may refer to data communication technologies that allow devices to communicate with one another or a base station without human intervention. For example, M2M or MTC may refer to communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

In some cases, an MTC device may operate using half-duplex (one-way) communications at a reduced peak rate. MTC devices may also be configured to enter a power saving "deep sleep" mode when not engaging in active communications. In some cases, MTC or IoT devices may be designed to support mission critical functions and wireless communications system may be configured to provide ultra-reliable communications for these functions.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as eNodeBs (eNBs) 105.

A base station 105 may be connected by an S1 interface to the core network 130. The core network may be an evolved packet core (EPC), which may include at least one mobility management entity (MME), at least one serving gateway (SGW), and at least one packet data network (PDN) gateway (PGW). The MME may be the control node that processes the signaling between the UE 115 and the EPC. All user Internet Protocol (IP) packets may be transferred through the SGW, which itself may be connected to the PGW. The PGW may provide IP address allocation as well as other functions. The PGW may be connected to the network operators IP services. The operators IP services may include the Internet, the Intranet, an IP Multimedia Subsystem (IMS), and a Packet-Switched (PS) Streaming Service (PSS).

The core network 130 may provide user authentication, access authorization, tracking, IP connectivity, and other access, routing, or mobility functions. At least some of the network devices, such as base station 105, may include subcomponents such as an access network entity, which may be an example of an access node controller (ANC). Each access network entity may communicate with a number of UEs 115 through a number of other access network transmission entities, each of which may be an example of a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate in an ultra high frequency (UHF) frequency region using frequency bands from 700 MHz to 2600 MHz (2.6 GHz), although in some cases a wireless local area network (WLAN) may use frequencies as high as 4 GHz. This region may also be known as the decimeter band, since the wavelengths range from approximately one decimeter to one meter in length. UHF waves may propagate mainly by line of sight, and may be blocked by buildings and environmental features. However, the waves may penetrate walls sufficiently to provide service to UEs 115 located indoors. Transmission of UHF waves is characterized by smaller antennas and shorter range (e.g., less than 100 km) compared to transmission using the smaller frequencies (and longer waves) of the high frequency (HF) or very high frequency (VHF) portion of the spectrum. In some cases, wireless communications system 100 may also utilize extremely high frequency (EHF) portions of the spectrum (e.g., from 30 GHz to 300 GHz). This region may also be known as the millimeter band, since the wavelengths range from approximately one millimeter to one centimeter in length. Thus, EHF antennas may be even smaller and more closely spaced than UHF antennas. In some cases, this may facilitate use of antenna arrays within a UE 115 (e.g., for directional beamforming). However, EHF transmissions may be subject to even greater atmospheric attenuation and shorter range than UHF transmissions.

Thus, wireless communications system 100 may support millimeter wave (mmW) communications between UEs 115 and base stations 105. Devices operating in mmW or EHF bands may have multiple antennas to allow beamforming. That is, a base station 105 may use multiple antennas or antenna arrays to conduct beamforming operations for directional communications with a UE 115. Beamforming (which may also be referred to as spatial filtering or directional transmission) is a signal processing technique that may be used at a transmitter (e.g., a base station 115) to shape and/or steer an overall antenna beam in the direction of a target receiver (e.g., a UE 115). This may be achieved by combining elements in an antenna array in such a way that transmitted signals at particular angles experience constructive interference while others experience destructive interference.

Multiple-input multiple-output (MIMO) wireless systems use a transmission scheme between a transmitter (e.g., a base station) and a receiver (e.g., a UE), where both transmitter and receiver are equipped with multiple antennas. Some portions of wireless communications system 100 may use beamforming. For example, base station 105 may have an antenna array with a number of rows and columns of antenna ports that the base station 105 may use for beamforming in its communication with UE 115. Signals may be transmitted multiple times in different directions (e.g., each transmission may be beamformed differently). A mmW receiver (e.g., a UE 115) may try multiple beams (e.g., antenna subarrays) while receiving the synchronization signals.

In some cases, the antennas of a base station 105 or UE 115 may be located within one or more antenna arrays, which may support beamforming or MIMO operation. One or more base station antennas or antenna arrays may be collocated at an antenna assembly, such as an antenna tower. In some cases, antennas or antenna arrays associated with a base station 105 may be located in diverse geographic locations. A base station 105 may multiple use antennas or antenna arrays to conduct beamforming operations for directional communications with a UE 115.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use Hybrid ARQ (HARM) to provide retransmission at the MAC layer to improve link efficiency. In the control plane, the Radio Resource Control (RRC) protocol layer may provide establishment, configuration, and maintenance of an RRC connection between a UE 115 and a network device 105-c, network device 105-b, or core network 130 supporting radio bearers for user plane data. At the Physical (PHY) layer, transport channels may be mapped to physical channels.

Time intervals in LTE or NR may be expressed in multiples of a basic time unit (which may be a sampling period of $T_s=1/30,720,000$ seconds). Time resources may be organized according to radio frames of length of 10 ms ($T_f=307200T_s$), which may be identified by a system frame number (SFN) ranging from 0 to 1023. Each frame may include ten 1 ms subframes numbered from 0 to 9. A subframe may be further divided into two 0.5 ms slots, each of which contains 6 or 7 modulation symbol periods (depending on the length of the cyclic prefix prepended to each symbol). Excluding the cyclic prefix, each symbol contains 2048 sample periods. In some cases the subframe may be the smallest scheduling unit, also known as a TTI. In other cases, a TTI may be shorter than a subframe or may be dynamically selected (e.g., in short TTI bursts or in selected component carriers using short TTIs).

A resource element may consist of one symbol period and one subcarrier (e.g., a 15 KHz frequency range). A resource block may contain 12 consecutive subcarriers in the frequency domain and, for a normal cyclic prefix in each orthogonal frequency division multiplexed (OFDM) symbol, 7 consecutive OFDM symbols in the time domain (1 slot), or 84 resource elements. The number of bits carried by each resource element may depend on the modulation scheme (the configuration of symbols that may be selected during each symbol period). Thus, the more resource blocks that a UE receives and the higher the modulation scheme, the higher the data rate may be.

In some cases, wireless system 100 may utilize both licensed and unlicensed radio frequency spectrum bands. For example, wireless system 100 may employ LTE License Assisted Access (LTE-LAA) or LTE Unlicensed (LTE U) radio access technology or NR technology in an unlicensed band such as the 5 Ghz Industrial, Scientific, and Medical (ISM) band. When operating in unlicensed radio frequency spectrum bands, wireless devices such as base stations 105 and UEs 115 may employ listen-before-talk (LBT) procedures to ensure the channel is clear before transmitting data. Operations in unlicensed spectrum may include downlink transmissions, uplink transmissions, or both. Duplexing in unlicensed spectrum may be based on frequency division duplexing (FDD), time division duplexing (TDD) or a combination of both.

Wireless communication system 100 may include base station 105 and/or UE 115 that are configured to support aspects of the described techniques for on-demand time-interleaving. For example, a first wireless device, such as a UE 115 or a base station 105, may be in communication with a second wireless device, which may also be either a UE 115 or a base station 105. For example, when the first wireless device is a UE 115, the second wireless device may be a base station 105. Alternatively, when the first wireless device is a base station 105, the second wireless device may be a UE 115. In one example, the second wireless device may identify and implement a time-interleaved transmission scheme based on channel conditions. The second wireless device may determine that the channel conditions have met or otherwise satisfied a threshold. Based on this determination, the second wireless device may identify the time-interleaved transmission scheme to use for transmission of block(s) of encoded information. The time-interleaved transmission scheme may include transmission of the block(s) of encoded information during different symbol periods of a slot and/or across multiple slots. The time-interleaved transmission scheme may also include using different frequencies or subcarriers for the transmission of the block(s) of encoded information. The time-interleaved transmission scheme may also include a dense pilot signal transmission configuration that includes transmission of pilot signals in a plurality of different symbol periods. The time-interleaved transmission scheme may improve communications in a high Doppler scenario, for example, where the channel conditions impede conventional communications.

In some aspects, the first wireless device may be configured to detect the channel condition and implement the time-interleaved transmission scheme. For example, a UE 115 may determine that the channel condition has satisfied or otherwise met the threshold. The UE 115 may transmit a message to a base station 105 that includes a request for the time-interleaved transmission scheme for the block(s) of encoded information. The UE 115 may receive the block(s) of encoded information according to the time-interleaved transmission scheme and may de-interleave the encoded information.

Figure 2:
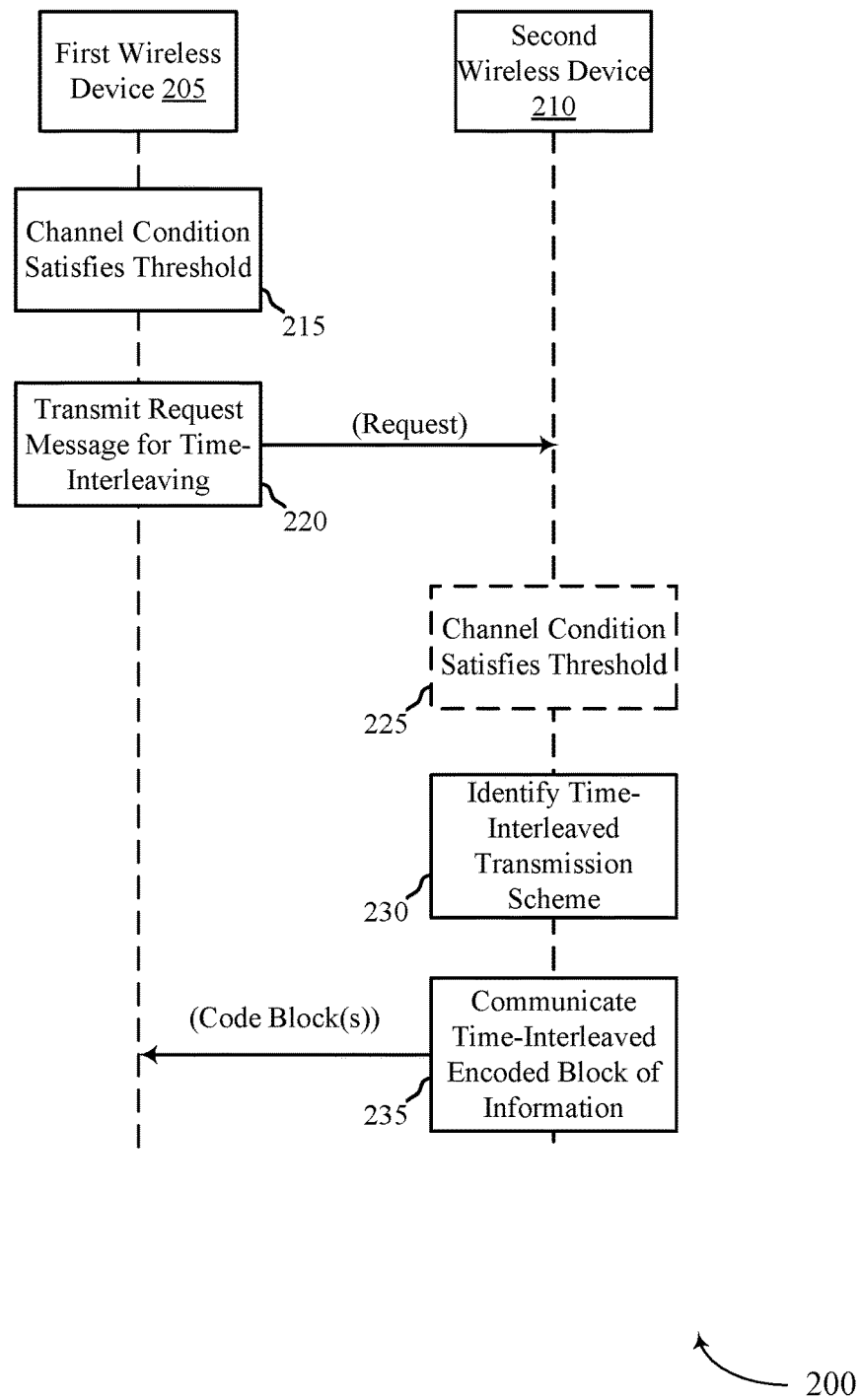
FIG. 2 illustrates an example of a process flow that supports on-demand time-interleaving in accordance with aspects of the present disclosure.

FIG. 2 illustrates an example of a process flow 200 for on-demand time-interleaving. Process flow 200 may implement aspects of wireless communication system 100 of FIG. 1. Process flow 200 may include a first wireless device 205 and a second wireless device 210. In some instances, first wireless device 205 may be an example of a UE 115, while second wireless device 210 may be an example of a base station 105 serving the first wireless device 205. In other examples, first wireless device 205 may be an example of a base station 105, while second wireless device 210 may be an example of a UE 105 served by the first wireless device 205.

Broadly, the process flow 200 illustrates one example where the channel condition is not optimal, (e.g., high Doppler, high interference, high fading, low SINR, etc.). The first wireless device 205 may signal to the second wireless device 210 to request a pilot signal pattern that is less dense in the time domain and also to enable time-interleaving of code blocks across groups of multiple OFDM symbol periods. The signal from the first wireless device 205 may include a request for the time-interleaved transmission scheme. Accordingly, use of an interleaver at the second wireless device 210 according to the time-interleaved transmission scheme may support a block level error rate for the code blocks using time diversity with respect to fading and, also, spreading the highest channel estimation error across multiple code blocks.

At 215, the first wireless device 205 may determine that a channel condition has satisfied at least one channel condition threshold. Examples of the channel condition may include, but are not limited to, one or more of a Doppler parameter associated with the channel, a SINR associated with the channel, an interference level for the channel, a fading parameter associated with the channel, and the like. The first wireless device 205 may determine that the channel condition has satisfied the threshold based on measurements and/or monitoring the channel conditions over a time period and/or based on monitoring feedback signals from other wireless devices (e.g., UEs or base stations).

Satisfying the threshold may include the channel condition meeting a predetermined threshold level, (e.g., a predetermined interference level, a predetermined Doppler parameter, etc.). The UE 205 may monitor the associated channel conditions and determine that the channel conditions have reached or otherwise satisfied the threshold once the monitored level reaches the threshold value.

At 220, the first wireless device 205 may transmit a message to the second wireless device 210. The message may be transmitted in response to the first wireless device 205 determining that the channel condition has satisfied the threshold. The message may include or otherwise convey a request for a time-interleaved transmission scheme for block(s) of encoded information. In some aspects, the message may be transmitted on a physical uplink control channel (PUCCH), a physical uplink shared channel (PUSCH), or some other channel associated with uplink communications from the first wireless device 205 to the second wireless device 210. In some aspects, the message may be transmitted on a physical downlink control channel (PDCCH), a physical downlink shared channel (PDSCH), or some other channel associated with downlink communications from the first wireless device 205 to the second wireless device 210.

In some aspects, the message may include one or more bits, fields, etc., that includes the request for the second wireless device 210 to use the time-interleaved transmission scheme. In some aspects, the message may convey the request by including information associated with the channel condition, (e.g., the actual channel condition level). In some aspects, the message may convey a flag indicator to convey the request to the second wireless device 210.

At 225, the second wireless device 210 may optionally determine that the channel condition has satisfied the at least one channel condition threshold. That is, the described techniques may be initiated by the first wireless device 205 (as is described with respect to steps 215 and 220). In other aspects, the second wireless device 210 may determine that the channel condition has satisfied the threshold autonomously, for example, without receiving the message from the first wireless device 205. For example, the second wireless device 210 may monitor the channel conditions between the second wireless device 210 and the first wireless device 205 over a predetermined time period, as needed, etc. The second wireless device 210 may determine that the channel conditions have satisfied the at least one channel condition threshold once the monitored condition reaches a preset threshold value.

At 230, the second wireless device 210 may identify the time-interleaved transmission scheme for the block(s) of encoded information. The time-interleaved transmissions scheme may include transmitting different portions of the block(s) of encoded information during a plurality of different symbol periods and/or during a same symbol period. The time-interleaved transmission scheme may include transmitting the block(s) (or different portions of the block(s)) during different symbol periods of the same slot and/or of more than one slot.

In some aspects, the time-interleaved transmission scheme may include a dense pilot signal transmission scheme or a decreased pilot signal density pattern. For example, the time-interleaved transmission scheme may include transmitting a decreased number of pilot signals during a plurality of symbol periods of a slot and/or multiple slots. The pilot signals may be transmitted according to a fixed pattern (e.g., every other symbol, every third symbol, and so on) and/or according to variable pattern (e.g., randomly dispersed during different symbol periods of the slot(s)). The pilot signals may also be transmitted on multiple subcarriers or frequencies. The decreased pilot signal density pattern may improve channel estimation at the first wireless device 205, for example.

At 235, the second wireless device 210 may communicate the block(s) of encoded information to the first wireless device 205 according to the time-interleaved transmission scheme, (e.g., during different symbol periods, during a same symbol period, across multiple slots, etc.). Also, the communication may include transmitting the pilot signals according to the decreased pilot signal density pattern.

In some aspects, the second wireless device 210 may include an interleaver that implements one or more aspects of the time-interleaved transmission scheme. Examples of interleavers may include, but are not limited to, a random interleaver (e.g., based on a random sequence), a block interleaver (e.g., a row-column interleaver or a row-column interleaver with permutations), a convolutional interleaver (e.g., a triangular interleaver), a multiplexed (e.g., shift register) interleaver, and the like.

Figure 3:
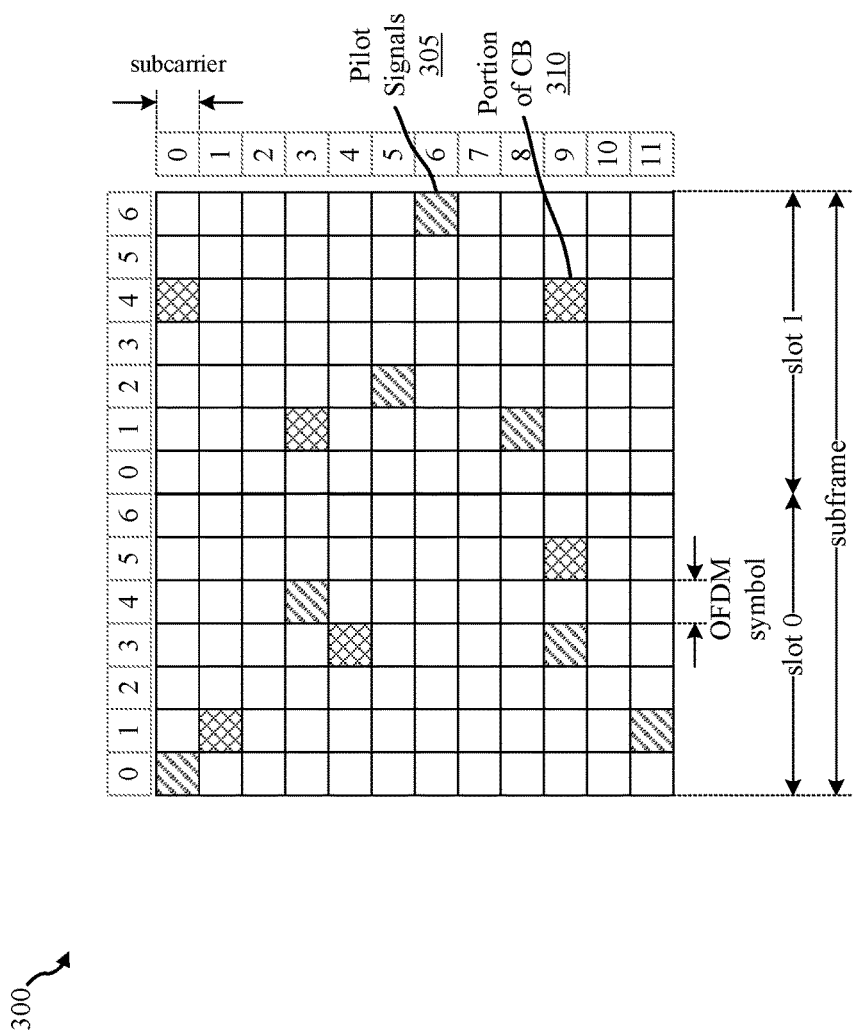
FIG. 3 illustrates an example of a frame structure that supports on-demand time-interleaving in accordance with aspects of the present disclosure.

FIG. 3 illustrates an example of a frame structure 300 for on-demand time-interleaving. Frame structure 300 may implement one or more aspects of wireless communication system 100 and/or process flow 200 of FIGS. 1 and 2. For example, a base station and/or a UE may be configured to communicate using frame structure 300.

Generally, frame structure 300 may be considered a downlink frame structure for a subframe. The subframe may include two slots (slot 0 and slot 1), with each slot including seven symbol periods (OFDM symbols 0-6). The frame structure 300 may also include twelve subcarriers (subcarriers 0-11). A resource element may include one symbol period and one subcarrier, such that the frame structure 300 may include 168 resource elements (e.g., 12 subcarriers×14 symbol periods).

It is to be understood that the frame structure 300 is but one example of a frame structure that can be used with the described techniques for on-demand time-interleaving. Other frame structures may also be used, which may have more or less symbol periods and/or more or less subcarriers. Also, the frame structure is not limited to a subframe having two slots, but may include a different number of slots. In some aspects, the frame structure 300 may implement a self-contained slot (SC-S) frame structure and/or a non-self-contained slot (NSC-S) frame structure.

Broadly, frame structure 300 illustrates one example of a frame structure transmitted in accordance with the described time-interleaved transmission scheme. The frame structure 300 may be implemented based on autonomous implementation by a second wireless device of the time-interleaved transmission scheme and/or based on the second wireless device receiving a request for the time-interleaved transmission scheme from a first wireless device (such as a UE when the second wireless device is a base station, or such as a base station when the second wireless device is a UE).

The frame structure 300 may include transmission of a plurality of pilot signals 305 (only one pilot signal 305 being labeled for ease of reference). The pilot signals 305 may be transmitted according to the described decreased pilot density pattern where the pilot signals 305 are transmitted during a plurality of different symbol periods. Furthermore, the pilot signals 305 are transmitted using different subcarriers. In the example frame structure 300, the pilot signals 305 are transmitted during symbol periods 0, 1, and 4 of slot 0 and during symbol periods 1, 2, and 6 of slot 1. Also in the example frame structure 300, the pilot signals 305 are transmitted on subcarriers 0, 3, and 11 during slot 0 and transmitted on subcarriers 5 and 6 during slot 1. It is to be understood that transmission of pilot signals 305 is not limited to the example illustrated in frame structure 300 and, instead may include the transmission of more or less pilot signals during additional or different symbol periods and/or on additional or different subcarriers. Additionally, pilot signals need not be limited to single symbol periods, but may instead be transmitted over more than one symbol period. In some cases, a pilot signal may span an entire slot.

The frame structure 300 may also include transmission of a plurality of code block(s) 310 (or portions of a code block). The code blocks 310 may be transmitted according to the described time-interleaved transmission scheme where the code blocks 310 are transmitted during a plurality of different symbol periods and/or during the same symbol period. Furthermore, the code blocks 310 are transmitted using different subcarriers. In the example frame structure 300, the code blocks 310 are transmitted during symbol periods 1, 3, and 5 of slot 0 and during symbol periods 1 and 4 of slot 1. Also in the example frame structure 300, the symbol blocks 310 are transmitted on subcarriers 1, 4, and 9 during slot 0 and transmitted on subcarriers 0, 3, and 9 during slot 1. It is to be understood that transmission of code blocks 310 is not limited to the example illustrated in frame structure 300 and, instead may include the transmission of more or less code blocks 310 during additional or different symbol periods and/or on additional or different subcarriers.

Figure 4:
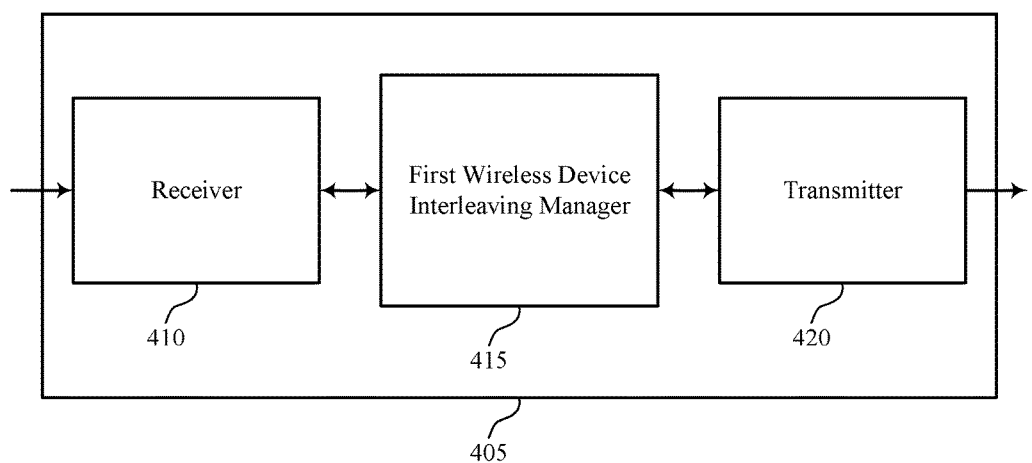
FIGS. 4 through 6 show block diagrams of a device that supports on-demand time-interleaving in accordance with aspects of the present disclosure.

FIG. 4 shows a block diagram 400 of a wireless device 405 that supports on-demand time-interleaving in accordance with various aspects of the present disclosure. Wireless device 405 may be an example of aspects of a UE 115 as described with reference to FIGS. 1 through 3. Alternatively, wireless device 405 may be an example of aspects of a base station 105 as described with reference to FIGS. 1 through 3. Wireless device 405 may include a receiver 410, a first wireless device interleaving manager 415, and a transmitter 420. Wireless device 405 may also include a processor. Each of these components may be in communication with one another (e.g., via one or more buses).

Receiver 410 may receive information such as packets, user data, or control information associated with various information channels (e.g., control channels, data channels, and information related to on-demand time-interleaving, etc.). Information may be passed on to other components of the device. The receiver 410 may be an example of aspects of the transceiver 735 described with reference to FIG. 7 or the transceiver 1135 described with reference to FIG. 11.

First wireless device interleaving manager 415 may be an example of aspects of the UE interleaving manager 715 described with reference to FIG. 7. First wireless device interleaving manager 415 may determine that a channel condition satisfies at least one channel condition threshold. First wireless device interleaving manager 415 may, alone or in combination with transmitter 420, transmit, based on the channel condition satisfying the at least one channel condition threshold, a message to a second wireless device, the message including a request for a time-interleaved transmission scheme for one or more blocks of encoded information. First wireless device interleaving manager 415 may, alone or in combination with receiver 410, receive the one or more blocks of encoded information from the second wireless device in accordance with at least the time-interleaved transmission scheme, and de-interleave the one or more blocks of information.

Transmitter 420 may transmit signals generated by other components of the device. In some examples, the transmitter 420 may be collocated with a receiver 410 in a transceiver module. For example, the transmitter 420 may be an example of aspects of the transceiver 735 described with reference to FIG. 7 or the transceiver 1135 described with reference to FIG. 11. The transmitter 420 may include a single antenna, or it may include a set of antennas.

Figure 5:
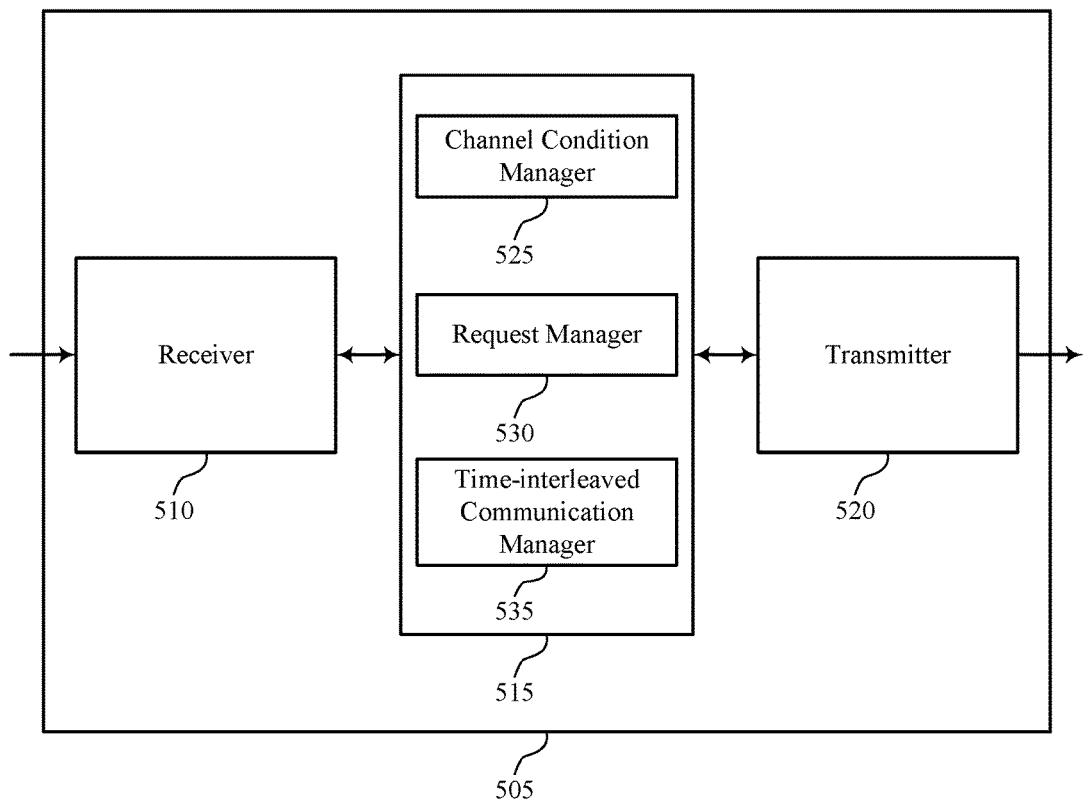

FIG. 5 shows a block diagram 500 of a wireless device 505 that supports on-demand time-interleaving in accordance with various aspects of the present disclosure. Wireless device 505 may be an example of aspects of a wireless device 405, which may be either a UE 115 or a base station 105 as described with reference to FIGS. 1 through 4. Wireless device 505 may include a receiver 510, a first wireless device interleaving manager 515, and a transmitter 520. Wireless device 505 may also include a processor. Each of these components may be in communication with one another (e.g., via one or more buses).

Receiver 510 may receive information such as packets, user data, or control information associated with various information channels (e.g., control channels, data channels, and information related to on-demand time-interleaving, etc.). Information may be passed on to other components of the device. The receiver 510 may be an example of aspects of the transceiver 735 described with reference to FIG. 7 or the transceiver 1135 described with reference to FIG. 11.

First wireless device interleaving manager 515 may be an example of aspects of the first wireless device interleaving manager 415 described with reference to FIG. 4, or the UE interleaving manager 715 described with reference to FIG. 7. First wireless device interleaving manager 515 may also include a channel condition manager 525, a request manager 530, and a time-interleaved communication manager 535.

Channel condition manager 525 may determine that a channel condition satisfies at least one channel condition threshold. Channel condition manager 525 may determine that a Doppler parameter associated with a channel is above the at least one channel condition threshold, where the channel condition includes the Doppler parameter. Channel condition manager 525 may determine that an interference level for a channel is above the at least one channel condition threshold, where the channel condition includes the interference level. Channel condition manager 525 may determine that a fading parameter associated with a channel is above the at least one channel condition threshold, where the channel condition includes the fading parameter.

Request manager 530 may transmit, based on the channel condition satisfying the at least one channel condition threshold, a message to a base station, the message including a request for a time-interleaved transmission scheme for one or more blocks of encoded information.

Time-interleaved communication manager 535 may receive the one or more blocks of encoded information from a second wireless device in accordance with at least the time-interleaved transmission scheme. Time-interleaved communication manager 535 may receive, in accordance with at least the time-interleaved transmission scheme, different portions of the one or more blocks of encoded information during a set of symbol periods. Time-interleaved communication manager 535 may receive, in accordance with at least the time-interleaved transmission scheme, different portions of the one or more blocks of encoded information during a same symbol period. Time-interleaved communication manager 535 may de-interleave the one or more blocks of encoded information.

Transmitter 520 may transmit signals generated by other components of the device. In some examples, the transmitter 520 may be collocated with a receiver 510 in a transceiver module. For example, the transmitter 520 may be an example of aspects of the transceiver 735 described with reference to FIG. 7 or the transceiver 1135 described with reference to FIG. 11. The transmitter 520 may include a single antenna, or it may include a set of antennas.

Figure 6:
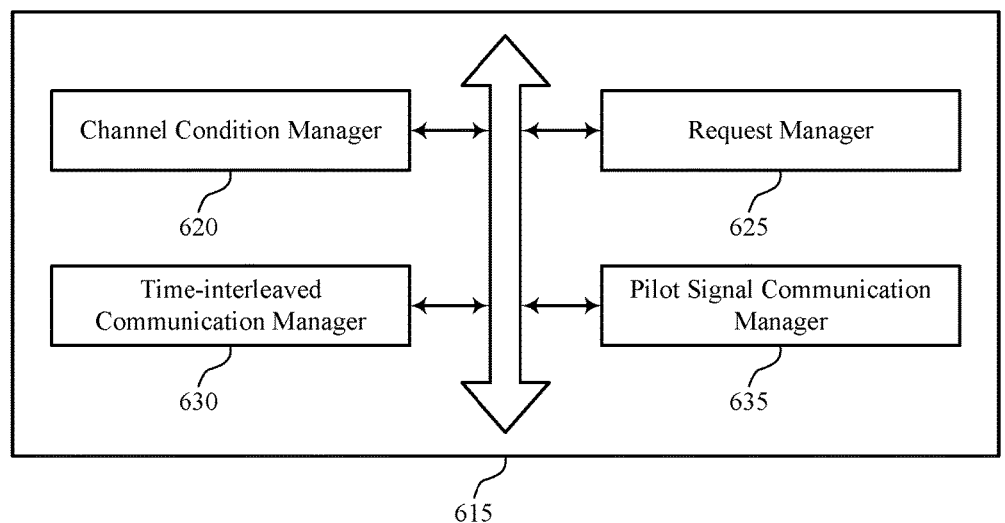

FIG. 6 shows a block diagram 600 of a first wireless device interleaving manager 615 that supports on-demand time-interleaving in accordance with various aspects of the present disclosure. The first wireless device interleaving manager 615 may be an example of aspects of a first wireless device interleaving manager 415, a first wireless device interleaving manager 515, or a UE interleaving manager 715 described with reference to FIGS. 4, 5, and 7. The first wireless device interleaving manager 615 may include a channel condition manager 620, a request manager 625, a time-interleaved communication manager 630, and a pilot signal communication manager 635. Each of these modules may communicate, directly or indirectly, with one another (e.g., via one or more buses).

Channel condition manager 620 may determine that a channel condition satisfies at least one channel condition threshold. Channel condition manager 620 may determine that a Doppler parameter associated with a channel is above the at least one channel condition threshold, where the channel condition includes the Doppler parameter. Channel condition manager 620 may determine that an interference level for a channel is above the at least one channel condition threshold, where the channel condition includes the interference level. Channel condition manager 620 may determine that a fading parameter associated with a channel is above the at least one channel condition threshold, where the channel condition includes the fading parameter.

Request manager 625 may transmit, based on the channel condition satisfying the at least one channel condition threshold, a message to a second wireless device, the message including a request for a time-interleaved transmission scheme for one or more blocks of encoded information.

Time-interleaved communication manager 630 may receive the one or more blocks of encoded information from the second wireless device in accordance with at least the time-interleaved transmission scheme. Time-interleaved communication manager 630 may receive, in accordance with at least the time-interleaved transmission scheme, different portions of the one or more blocks of encoded information during a set of symbol periods. Time-interleaved communication manager 630 may receive, in accordance with at least the time-interleaved transmission scheme, different portions of the one or more blocks of encoded information during a same symbol period. Time-interleaved communication manager 630 may also de-interleave the one or more blocks of encoded information.

Pilot signal communication manager 635 may receive, in accordance with at least the time-interleaved transmission scheme, a set of pilot signals during a set of symbol periods. Pilot signal communication manager 635 may perform a channel estimation procedure based on the set of pilot signals. Pilot signal communication manager 635 may apply a channel estimation value to different portions of the one or more blocks of encoded information that are received during a set of different symbol periods. In some cases, the time-interleaved transmission scheme includes a decreased pilot signal density pattern.

Figure 7:
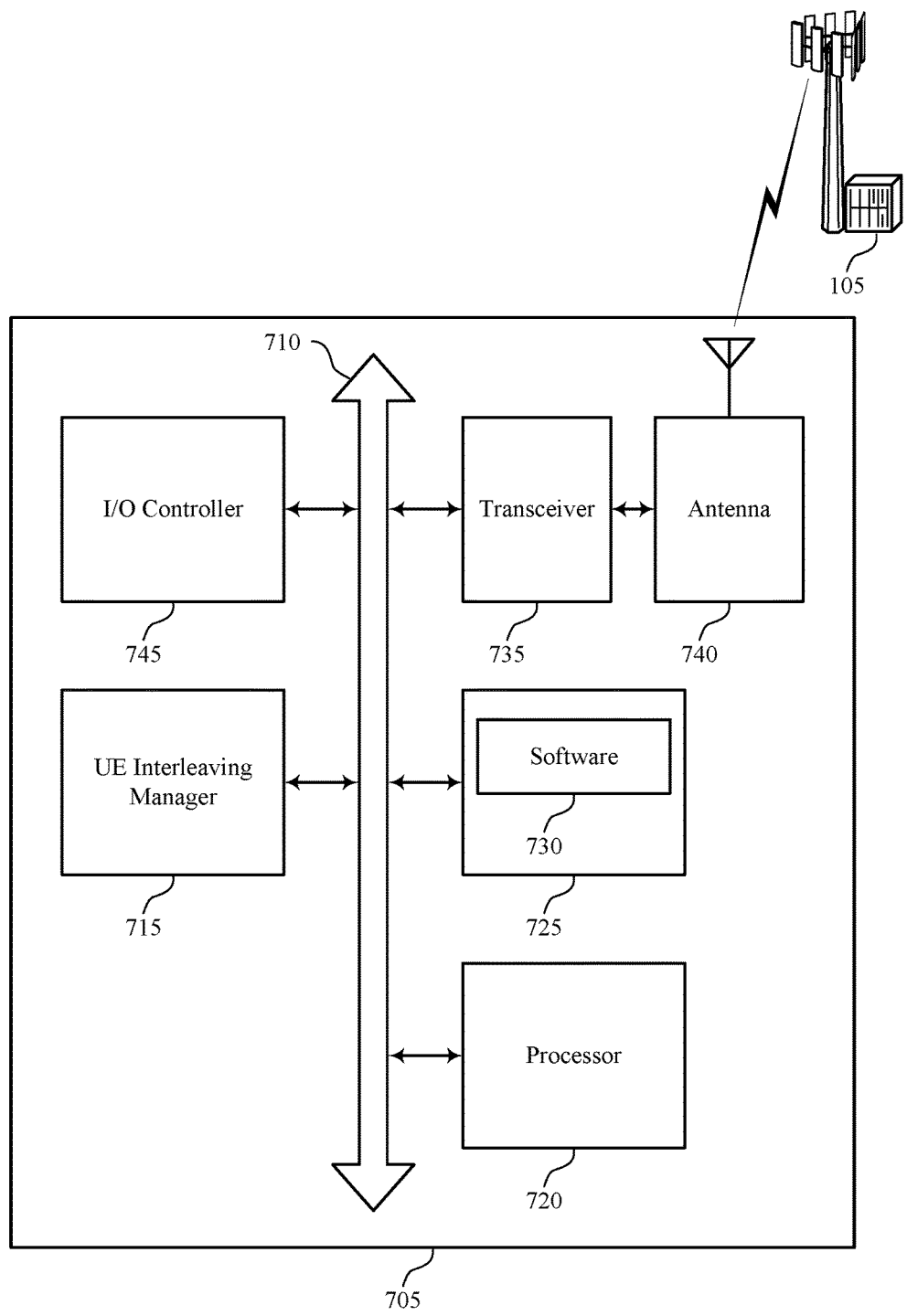
FIG. 7 illustrates a block diagram of a system including a UE that supports on-demand time-interleaving in accordance with aspects of the present disclosure.

FIG. 7 shows a diagram of a system 700 including a device 705 that supports on-demand time-interleaving in accordance with various aspects of the present disclosure. Device 705 may be an example of or include the components of wireless device 405, wireless device 505, or a UE 115 as described above, for example, with reference to FIGS. 1 through 5. Device 705 may include components for bi-directional voice and data communications including components for transmitting and receiving communications, including a UE interleaving manager 715, a processor 720, a memory 725, a software 730, a transceiver 735, an antenna 740, and an I/O controller 745. These components may be in electronic communication via one or more busses (e.g., bus 710). Device 705 may communicate wirelessly with one or more base stations 105.

Processor 720 may include an intelligent hardware device, (e.g., a general-purpose processor, a digital signal processor (DSP), a central processing unit (CPU), a microcontroller, an application-specific integrated circuit (ASIC), a field-programmable gate array (FPGA), a programmable logic device, a discrete gate or transistor logic component, a discrete hardware component, or any combination thereof). In some cases, processor 720 may be configured to operate a memory array using a memory controller. In other cases, a memory controller may be integrated into processor 720. Processor 720 may be configured to execute computer-readable instructions stored in a memory to perform various functions (e.g., functions or tasks supporting on-demand time-interleaving).

Memory 725 may include random access memory (RAM) and read only memory (ROM). The memory 725 may store computer-readable, computer-executable software 730 including instructions that, when executed, cause the processor to perform various functions described herein. In some cases, the memory 725 may contain, among other things, a basic input/output system (BIOS) which may control basic hardware and/or software operation such as the interaction with peripheral components or devices.

Software 730 may include code to implement aspects of the present disclosure, including code to support on-demand time-interleaving. Software 730 may be stored in a non-transitory computer-readable medium such as system memory or other memory. In some cases, the software 730 may not be directly executable by the processor but may cause a computer (e.g., when compiled and executed) to perform functions described herein.

Transceiver 735 may communicate bi-directionally, via one or more antennas, wired, or wireless links as described above. For example, the transceiver 735 may represent a wireless transceiver and may communicate bi-directionally with another wireless transceiver. The transceiver 735 may also include a modem to modulate the packets and provide the modulated packets to the antennas for transmission, and to demodulate packets received from the antennas.

In some cases, the wireless device may include a single antenna 740. However, in some cases the device may have more than one antenna 740, which may be capable of concurrently transmitting or receiving multiple wireless transmissions.

I/O controller 745 may manage input and output signals for device 705. I/O controller 745 may also manage peripherals not integrated into device 705. In some cases, I/O controller 745 may represent a physical connection or port to an external peripheral. In some cases, I/O controller 745 may utilize an operating system such as iOS®, ANDROID®, MS-DOS®, MS-WINDOWS®, OS/2®, UNIX®, LINUX®, or another known operating system.

UE interleaving manager 715 may be an example of the first wireless device interleaving manager 415, 515, and/or 615 described with reference to FIGS. 4 through 6.

Figure 8:
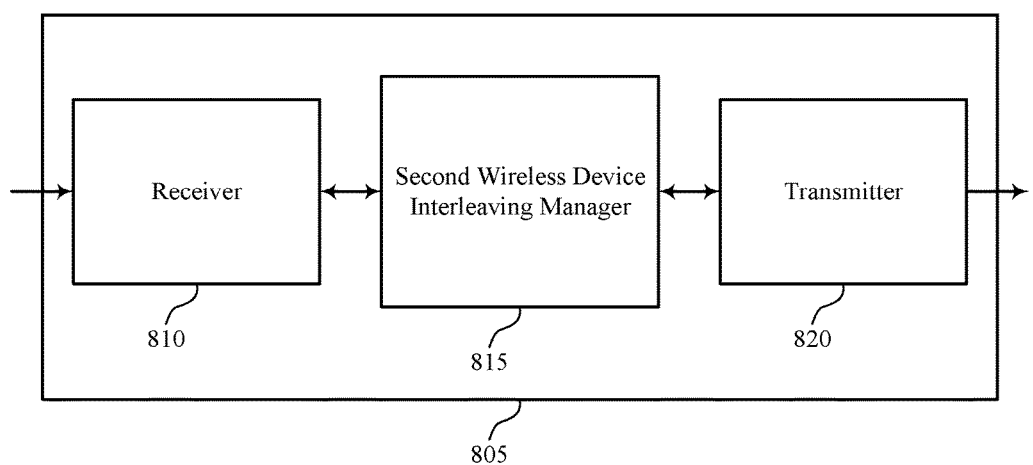
FIGS. 8 through 10 show block diagrams of a device that supports on-demand time-interleaving in accordance with aspects of the present disclosure.

FIG. 8 shows a block diagram 800 of a wireless device 805 that supports on-demand time-interleaving in accordance with various aspects of the present disclosure. Wireless device 805 may be an example of aspects of a base station 105 as described with reference to FIGS. 1 through 3. Alternatively, wireless device 805 may be an example of aspects of a UE 115 as described with reference to FIGS. 1 through 3. Wireless device 805 may include a receiver 810, a second wireless device interleaving manager 815, and a transmitter 820. Wireless device 805 may also include a processor. Each of these components may be in communication with one another (e.g., via one or more buses).

Receiver 810 may receive information such as packets, user data, or control information associated with various information channels (e.g., control channels, data channels, and information related to on-demand time-interleaving, etc.). Information may be passed on to other components of the device. The receiver 810 may be an example of aspects of the transceiver 735 described with reference to FIG. 7 or the transceiver 1135 described with reference to FIG. 11.

Second wireless device interleaving manager 815 may be an example of aspects of the base station interleaving manager 1115 described with reference to FIG. 11.

Second wireless device interleaving manager 815 may determine that a channel condition satisfies at least one channel condition threshold. Second wireless device interleaving manager 815 may identify, based on the channel condition satisfying the at least one channel condition threshold, a time-interleaved transmission scheme for one or more blocks of encoded information. Second wireless device interleaving manager 815 may, alone or in combination with transmitter 820, transmit the one or more blocks of encoded information to a first wireless device in accordance with at least the time-interleaved transmission scheme.

Transmitter 820 may transmit signals generated by other components of the device. In some examples, the transmitter 820 may be collocated with a receiver 810 in a transceiver module. For example, the transmitter 820 may be an example of aspects of the transceiver 735 described with reference to FIG. 7 or the transceiver 1135 described with reference to FIG. 11. The transmitter 820 may include a single antenna, or it may include a set of antennas.

Figure 9:
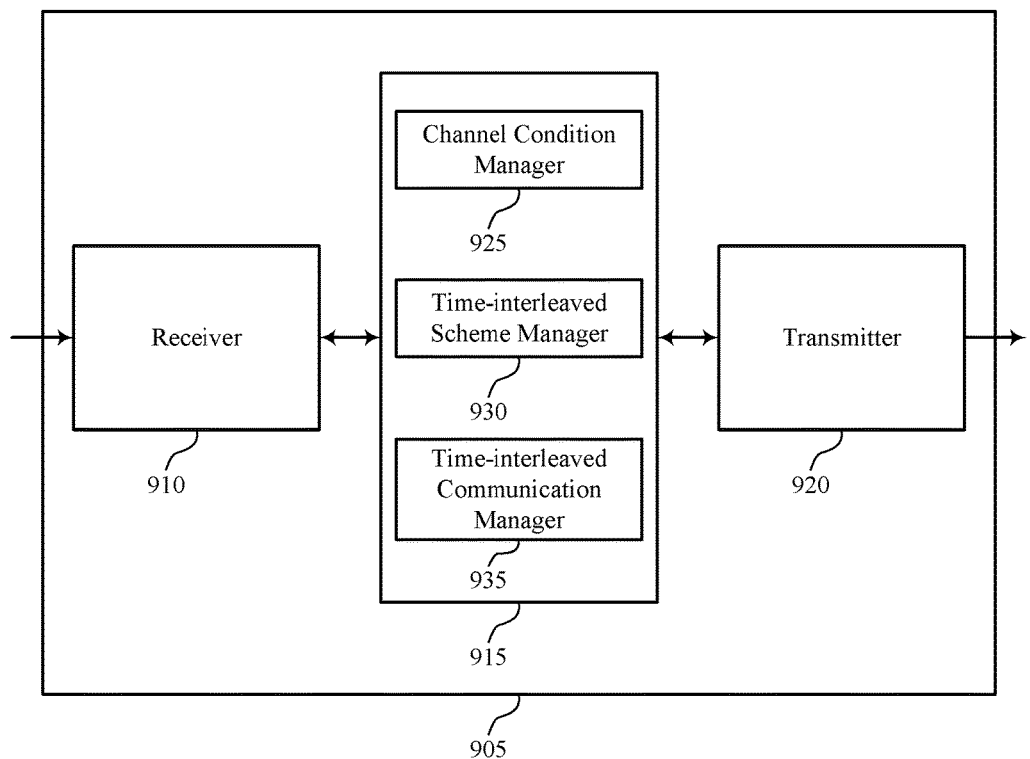

FIG. 9 shows a block diagram 900 of a wireless device 905 that supports on-demand time-interleaving in accordance with various aspects of the present disclosure. Wireless device 905 may be an example of aspects of a wireless device 805, which may be either a base station 105 or a UE 115 as described with reference to FIGS. 1 through 3 and 8. Wireless device 905 may include a receiver 910, a second wireless device interleaving manager 915, and a transmitter 920. Wireless device 905 may also include a processor. Each of these components may be in communication with one another (e.g., via one or more buses).

Receiver 910 may receive information such as packets, user data, or control information associated with various information channels (e.g., control channels, data channels, and information related to on-demand time-interleaving, etc.). Information may be passed on to other components of the device. The receiver 910 may be an example of aspects of the transceiver 735 described with reference to FIG. 7 or the transceiver 1135 described with reference to FIG. 11.

Second wireless device interleaving manager 915 may be an example of aspects of the second wireless device interleaving manager 1115 described with reference to FIG. 11. Second wireless device interleaving manager 915 may also include a channel condition manager 925, a time-interleaved scheme manager 930, and a time-interleaved communication manager 935.

Channel condition manager 925 may determine that a channel condition satisfies at least one channel condition threshold. Channel condition manager 925 may determine that a Doppler parameter associated with a channel is above the at least one channel condition threshold, where the channel condition includes the Doppler parameter. Channel condition manager 925 may determine that an interference level for a channel is above the at least one channel condition threshold, where the channel condition includes the interference level. Channel condition manager 925 may determine that a fading parameter associated with a channel is above the at least one channel condition threshold, where the channel condition includes the fading parameter.

Time-interleaved scheme manager 930 may identify, based on the channel condition satisfying the at least one channel condition threshold, a time-interleaved transmission scheme for one or more blocks of encoded information.

Time-interleaved communication manager 935 may transmit the one or more blocks of encoded information to a first wireless device in accordance with at least the time-interleaved transmission scheme. Time-interleaved communication manager 935 may transmit, in accordance with at least the time-interleaved transmission scheme, different portions of the one or more blocks of encoded information during a set of symbol periods. Time-interleaved communication manager 935 may transmit, in accordance with at least the time-interleaved transmission scheme, different portions of the one or more blocks of encoded information during a same symbol period.

Transmitter 920 may transmit signals generated by other components of the device. In some examples, the transmitter 920 may be collocated with a receiver 910 in a transceiver module. For example, the transmitter 920 may be an example of aspects of the transceiver 735 described with reference to FIG. 7 or the transceiver 1135 described with reference to FIG. 11. The transmitter 920 may include a single antenna, or it may include a set of antennas.

Figure 10:
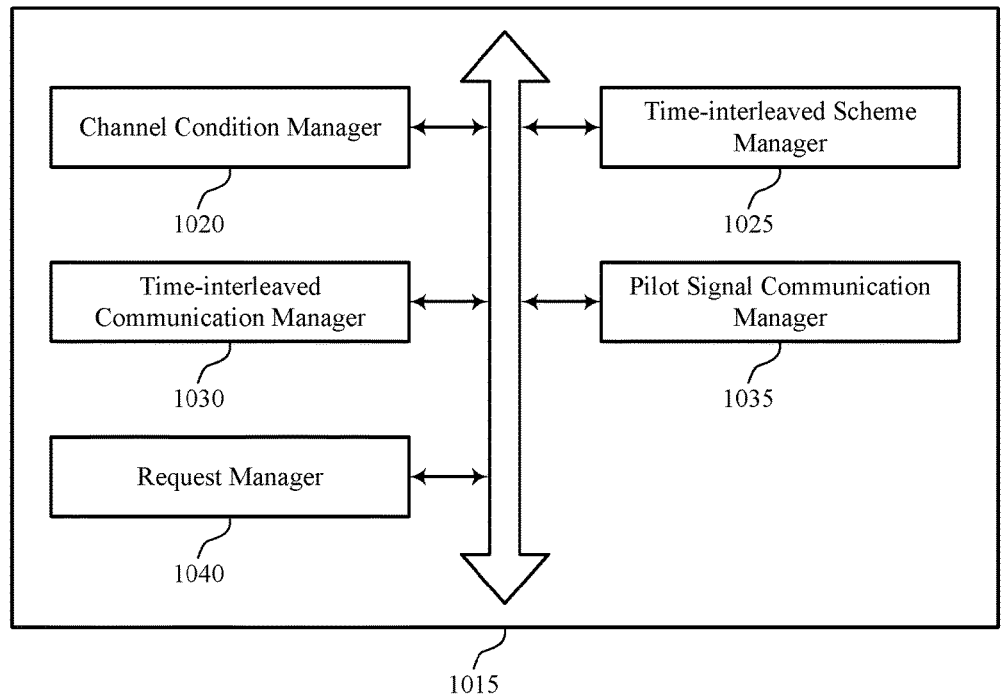

FIG. 10 shows a block diagram 1000 of a second wireless device interleaving manager 1015 that supports on-demand time-interleaving in accordance with various aspects of the present disclosure. The second wireless device interleaving manager 1015 may be an example of aspects of a second wireless device interleaving manager 815, a second wireless device interleaving manager 915, or a base station interleaving manager 1115 described with reference to FIGS. 8, 9, and 11. The second wireless device interleaving manager 1015 may include a channel condition manager 1020, a time-interleaved scheme manager 1025, a time-interleaved communication manager 1030, a pilot signal communication manager 1035, and a request manager 1040. Each of these modules may communicate, directly or indirectly, with one another (e.g., via one or more buses).

Channel condition manager 1020 may determine that a channel condition satisfies at least one channel condition threshold. Channel condition manager 1020 may determine that a Doppler parameter associated with a channel is above the at least one channel condition threshold, where the channel condition includes the Doppler parameter. Channel condition manager 1020 may determine that an interference level for a channel is above the at least one channel condition threshold, where the channel condition includes the interference level. Channel condition manager 1020 may determine that a fading parameter associated with a channel is above the at least one channel condition threshold, where the channel condition includes the fading parameter.

Time-interleaved scheme manager 1025 may identify, based on the channel condition satisfying the at least one channel condition threshold, a time-interleaved transmission scheme for one or more blocks of encoded information.

Time-interleaved communication manager 1030 may transmit the one or more blocks of encoded information to a first wireless device in accordance with at least the time-interleaved transmission scheme. Time-interleaved communication manager 1030 may transmit, in accordance with at least the time-interleaved transmission scheme, different portions of the one or more blocks of encoded information during a set of symbol periods. Time-interleaved communication manager 1030 may transmit, in accordance with at least the time-interleaved transmission scheme, different portions of the one or more blocks of encoded information during a same symbol period.

Pilot signal communication manager 1035 may transmit, in accordance with at least the time-interleaved transmission scheme, a set of pilot signals during a set of symbol period. In some cases, the time-interleaved transmission scheme includes a decreased pilot signal density pattern.

Request manager 1040 may receive a message from the first wireless device, the message including a request for a time-interleaved transmission scheme for one or more blocks of encoded information.

Figure 11:
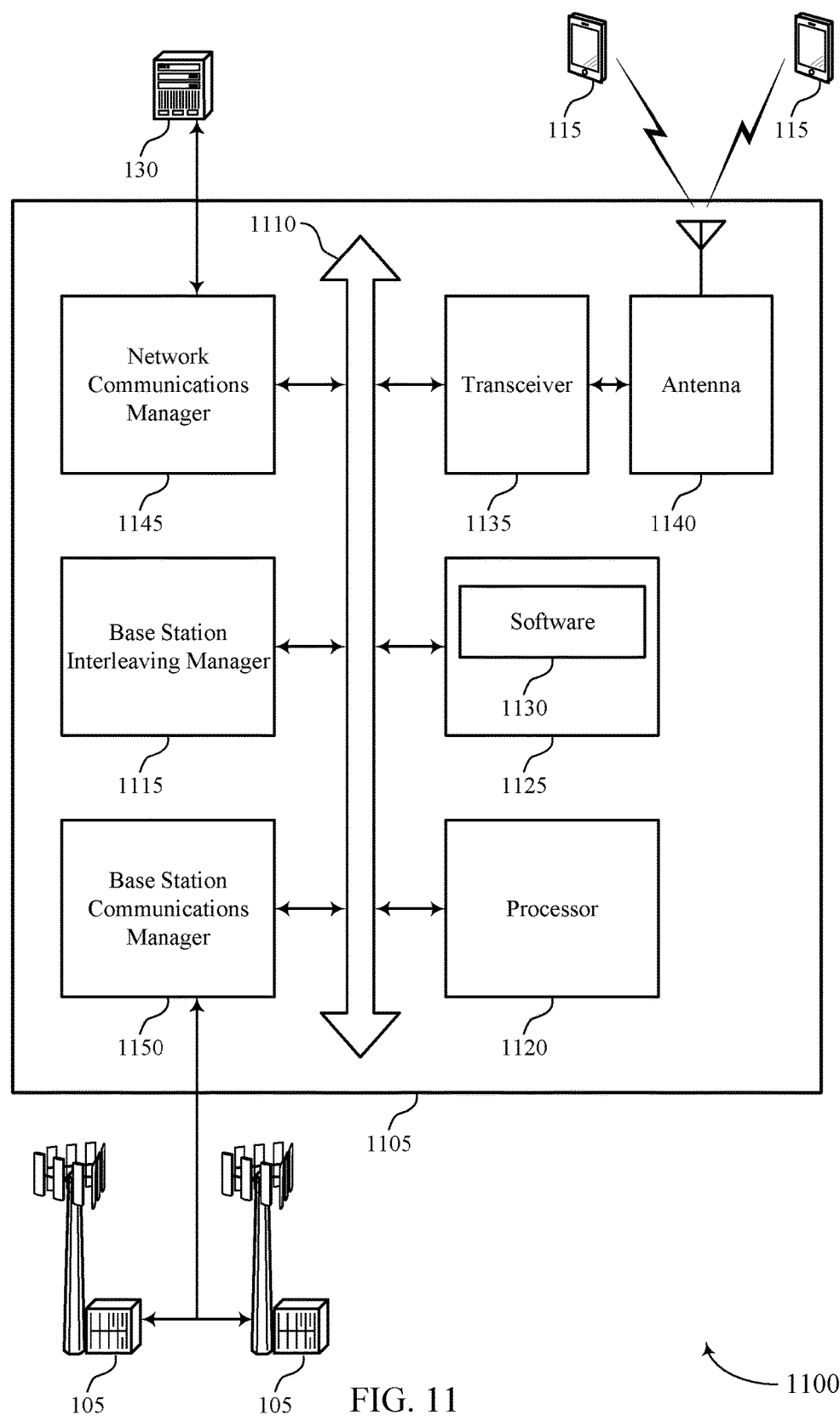
FIG. 11 illustrates a block diagram of a system including a base station that supports on-demand time-interleaving in accordance with aspects of the present disclosure.

FIG. 11 shows a diagram of a system 1100 including a device 1105 that supports on-demand time-interleaving in accordance with various aspects of the present disclosure. Device 1105 may be an example of or include the components of base station 105 as described above, for example, with reference to FIGS. 1 through 3. Device 1105 may include components for bi-directional voice and data communications including components for transmitting and receiving communications, including a base station interleaving manager 1115, a processor 1120, a memory 1125, a software 1130, a transceiver 1135, an antenna 1140, a network communications manager 1145, and a base station communications manager 1150. These components may be in electronic communication via one or more busses (e.g., bus 1110). Device 1105 may communicate wirelessly with one or more UEs 115.

Processor 1120 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1120 may be configured to operate a memory array using a memory controller. In other cases, a memory controller may be integrated into processor 1120. Processor 1120 may be configured to execute computer-readable instructions stored in a memory to perform various functions (e.g., functions or tasks supporting on-demand time-interleaving).

Memory 1125 may include RAM and ROM. The memory 1125 may store computer-readable, computer-executable software 1130 including instructions that, when executed, cause the processor to perform various functions described herein. In some cases, the memory 1125 may contain, among other things, a BIOS which may control basic hardware and/or software operation such as the interaction with peripheral components or devices.

Software 1130 may include code to implement aspects of the present disclosure, including code to support on-demand time-interleaving. Software 1130 may be stored in a non-transitory computer-readable medium such as system memory or other memory. In some cases, the software 1130 may not be directly executable by the processor but may cause a computer (e.g., when compiled and executed) to perform functions described herein.

Transceiver 1135 may communicate bi-directionally, via one or more antennas, wired, or wireless links as described above. For example, the transceiver 1135 may represent a wireless transceiver and may communicate bi-directionally with another wireless transceiver. The transceiver 1135 may also include a modem to modulate the packets and provide the modulated packets to the antennas for transmission, and to demodulate packets received from the antennas.

In some cases, the wireless device may include a single antenna 1140. However, in some cases the device may have more than one antenna 1140, which may be capable of concurrently transmitting or receiving multiple wireless transmissions.

Network communications manager 1145 may manage communications with the core network (e.g., via one or more wired backhaul links). For example, the network communications manager 1145 may manage the transfer of data communications for client devices, such as one or more UEs 115.

Base station communications manager 1150 may manage communications with other base station 105, and may include a controller or scheduler for controlling communications with UEs 115 in cooperation with other base stations 105. For example, the base station communications manager 1150 may coordinate scheduling for transmissions to UEs 115 for various interference mitigation techniques such as beamforming or joint transmission. In some examples, base station communications manager 1150 may provide an X2 interface within an LTE/LTE-A wireless communication network technology to provide communication between base stations 105.

Base station interleaving manager 1115 may be an example of the second wireless device interleaving manager 815, 915, and/or 1015 described with reference to FIGS. 8 through 10.

Figure 12:
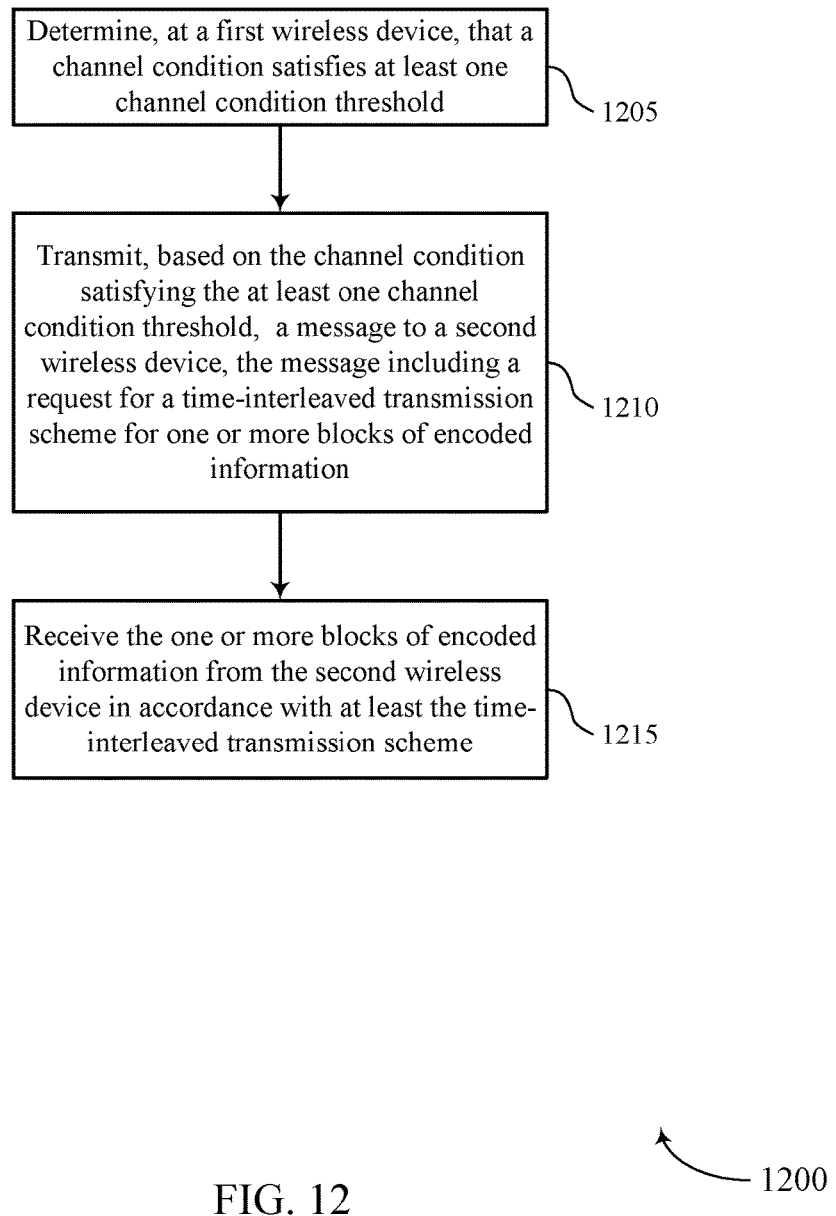
FIGS. 12 through 14 illustrate methods for on-demand time-interleaving in accordance with aspects of the present disclosure.

FIG. 12 shows a flowchart illustrating a method 1200 for on-demand time-interleaving in accordance with various aspects of the present disclosure. The operations of method 1200 may be implemented by either a UE 115 or its components as described herein, or a base station 105 or its components as described herein. For example, the operations of method 1200 may be performed by a first wireless device interleaving manager 415, 515, 615 as described with reference to FIGS. 4 through 6. Additionally, the operations of method 1200 may be performed by a UE interleaving manager 715 or a base station interleaving manager 1115 as described with reference to FIGS. 7 and 11 when the UE interleaving manager 715 or the base station interleaving manager 1115 are acting as examples of first wireless device interleaving managers 415, 515, 615. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1205 the first wireless device may determine that a channel condition satisfies at least one channel condition threshold. The operations of block 1205 may be performed according to the methods described with reference to FIGS. 1 through 3. In certain examples, aspects of the operations of block 1205 may be performed by a channel condition manager as described with reference to FIGS. 4 through 6.

At block 1210 the first wireless device may transmit, based at least in part on the channel condition satisfying the at least one channel condition threshold, a message to a second wireless device, the message comprising a request for a time-interleaved transmission scheme for one or more blocks of encoded information. The operations of block 1210 may be performed according to the methods described with reference to FIGS. 1 through 3. In certain examples, aspects of the operations of block 1210 may be performed by a request manager as described with reference to FIGS. 4 through 6.

At block 1215 the first wireless device may receive the one or more blocks of encoded information from the second wireless device in accordance with at least the time-interleaved transmission scheme. The operations of block 1215 may be performed according to the methods described with reference to FIGS. 1 through 3. In certain examples, aspects of the operations of block 1215 may be performed by a time-interleaved communication manager as described with reference to FIGS. 4 through 6.

Figure 13:
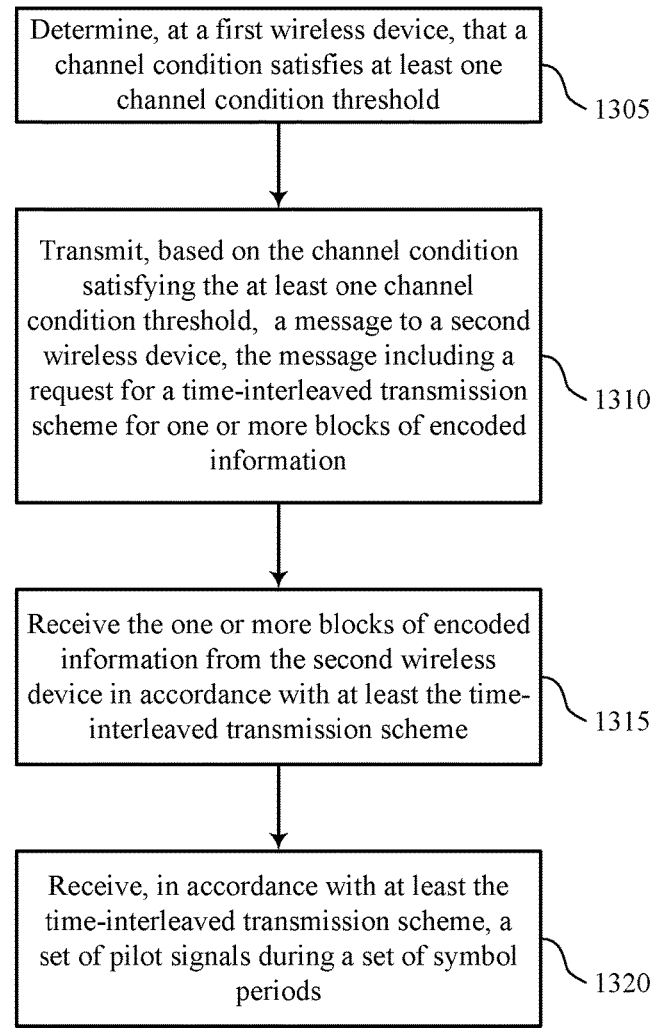

FIG. 13 shows a flowchart illustrating a method 1300 for on-demand time-interleaving in accordance with various aspects of the present disclosure. The operations of method 1300 may be implemented by either a UE 115 or its components as described herein, or a base station 105 or its components as described herein. For example, the operations of method 1300 may be performed by a first wireless device interleaving manager 415, 515, 615 as described with reference to FIGS. 4 through 6. Additionally, the operations of method 1300 may be performed by a UE interleaving manager 715 or a base station interleaving manager 1115 as described with reference to FIGS. 7 and 11 when the UE interleaving manager 715 or the base station interleaving manager 1115 are acting as examples of first wireless device interleaving managers 415, 515, 615. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1305 the first wireless device may determine that a channel condition satisfies at least one channel condition threshold. The operations of block 1305 may be performed according to the methods described with reference to FIGS. 1 through 3. In certain examples, aspects of the operations of block 1305 may be performed by a channel condition manager as described with reference to FIGS. 4 through 6.

At block 1310 the first wireless device may transmit, based at least in part on the channel condition satisfying the at least one channel condition threshold, a message to a second wireless device, the message comprising a request for a time-interleaved transmission scheme for one or more blocks of encoded information. The operations of block 1310 may be performed according to the methods described with reference to FIGS. 1 through 3. In certain examples, aspects of the operations of block 1310 may be performed by a request manager as described with reference to FIGS. 4 through 6.

At block 1315 the UE 115 may receive the one or more blocks of encoded information from the second wireless device in accordance with at least the time-interleaved transmission scheme. The operations of block 1315 may be performed according to the methods described with reference to FIGS. 1 through 3. In certain examples, aspects of the operations of block 1315 may be performed by a time-interleaved communication manager as described with reference to FIGS. 4 through 6.

At block 1320 the UE 115 may receive, in accordance with at least the time-interleaved transmission scheme, a plurality of pilot signals during a plurality of symbol periods. The operations of block 1320 may be performed according to the methods described with reference to FIGS. 1 through 3. In certain examples, aspects of the operations of block 1320 may be performed by a pilot signal communication manager as described with reference to FIGS. 4 through 6.

Figure 14:
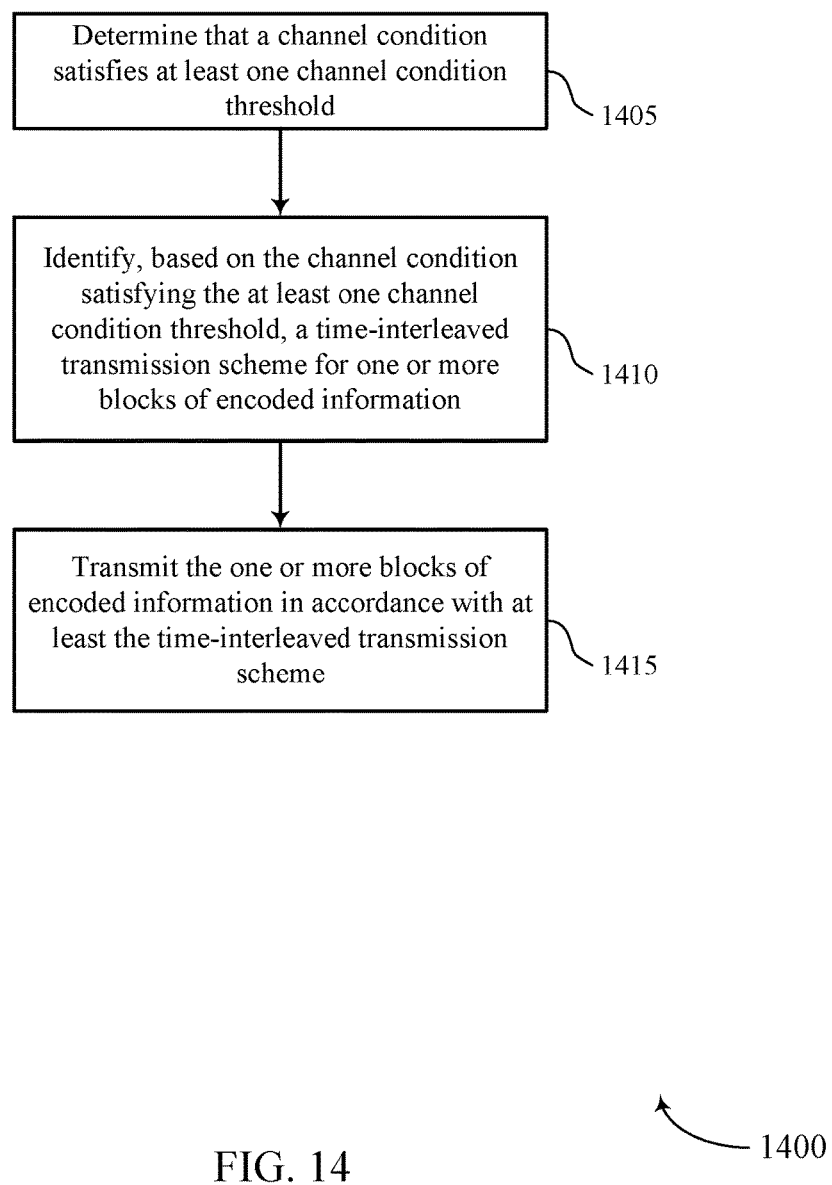

FIG. 14 shows a flowchart illustrating a method 1400 for on-demand time-interleaving in accordance with various aspects of the present disclosure. The operations of method 1400 may be implemented by either a UE 115 or its components as described herein, or a base station 105 or its components as described herein. For example, the operations of method 1400 may be performed by a second wireless device interleaving manager 815, 915, 1015 as described with reference to FIGS. 8 through 10. Additionally, the operations of method 1400 may be performed by a UE interleaving manager 715 or a base station interleaving manager 1115 as described with reference to FIGS. 7 and 11 when the UE interleaving manager 715 or the base station interleaving manager 1115 are acting as examples of second wireless device interleaving managers 815, 915, 1015. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1405 the device (e.g., a second wireless device) may determine that a channel condition satisfies at least one channel condition threshold. The operations of block 1405 may be performed according to the methods described with reference to FIGS. 1 through 3. In certain examples, aspects of the operations of block 1405 may be performed by a channel condition manager as described with reference to FIGS. 8 through 11.

At block 1410 the device (e.g., a second wireless device) may identify, based at least in part on the channel condition satisfying the at least one channel condition threshold, a time-interleaved transmission scheme for one or more blocks of encoded information. The operations of block 1410 may be performed according to the methods described with reference to FIGS. 1 through 3. In certain examples, aspects of the operations of block 1410 may be performed by a time-interleaved scheme manager as described with reference to FIGS. 8 through 11.

At block 1415 the device (e.g., a second wireless device) may transmit the one or more blocks of encoded information in accordance with at least the time-interleaved transmission scheme. The operations of block 1415 may be performed according to the methods described with reference to FIGS. 1 through 3. In certain examples, aspects of the operations of block 1415 may be performed by a time-interleaved communication manager as described with reference to FIGS. 8 through 11.

It should be noted that the methods described above describe possible implementations, and that the operations and the steps may be rearranged or otherwise modified and that other implementations are possible. Furthermore, aspects from two or more of the methods may be combined.

Techniques described herein may be used for various wireless communications systems such as code division multiple access (CDMA), time division multiple access (TDMA), frequency division multiple access (FDMA), OFDMA, single carrier frequency division multiple access (SC-FDMA), and other systems. The terms "system" and "network" are often used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1×, 1×, etc. IS-856 (TIA-856) is commonly referred to as CDMA2000 1×EV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications system (UMTS). 3GPP Long Term Evolution (LTE) and LTE-Advanced (LTE-A) are releases of Universal Mobile Telecommunications System (UMTS) that use E-UTRA. UTRA, E-UTRA, UMTS, LTE, LTE-A, NR, and Global System for Mobile communications (GSM) are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects an LTE or an NR system may be described for purposes of example, and LTE or NR terminology may be used in much of the description, the techniques described herein are applicable beyond LTE or NR applications.

In LTE/LTE-A networks, including such networks described herein, the term evolved node B (eNB) may be generally used to describe the base stations. The wireless communications system or systems described herein may include a heterogeneous LTE/LTE-A or NR network in which different types of evolved node B (eNBs) provide coverage for various geographical regions. For example, each eNB, gNB or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNodeB (eNB), next generation NodeB (gNB), Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, gNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 and 200 of FIGS. 1 and 2—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication at a first wireless device, comprising:
   determining, at a first wireless device, that a channel condition satisfies at least one channel condition threshold;
   transmitting, based at least in part on the channel condition satisfying the at least one channel condition threshold, a message to a second wireless device, the message comprising a request to initiate a time-interleaved transmission scheme for one or more blocks of encoded information; and
   receiving the one or more blocks of encoded information from the second wireless device in accordance with at least the time-interleaved transmission scheme.

2. The method of claim 1, further comprising:
   receiving, in accordance with at least the time-interleaved transmission scheme, different portions of the one or more blocks of encoded information during a plurality of symbol periods.

3. The method of claim 2, wherein the plurality of symbol periods are specific to the at least one channel condition threshold.

4. The method of claim 1, further comprising:
   receiving, in accordance with at least the time-interleaved transmission scheme, a plurality of pilot signals during a plurality of symbol periods.

5. The method of claim 4, wherein the time-interleaved transmission scheme comprises a decreased pilot signal density pattern.

6. The method of claim 4, further comprising:
   applying a channel estimation value to different portions of the one or more blocks of encoded information that are received during a plurality of different symbol periods.

7. The method of claim 1, further comprising:
   determining that one or more of a Doppler parameter associated with a channel, an interference level for a channel, or a fading parameter associated with a channel is above the at least one channel condition threshold, wherein the channel condition comprises one or more of the Doppler parameter, the interference level, or the fading parameter.

8. The method of claim 1, wherein the first wireless device is a user equipment (UE) and the second wireless device is a base station.

9. The method of claim 1, wherein the first wireless device is a base station and the second wireless device is a user equipment (UE).

10. A method for wireless communication, comprising:
    determining that a channel condition satisfies at least one channel condition threshold;
    identifying, based at least in part on the channel condition satisfying the at least one channel condition threshold, a time-interleaved transmission scheme for one or more blocks of encoded information; and
    transmitting different portions of the one or more blocks of encoded information during a plurality of symbol periods in accordance with at least the time-interleaved transmission scheme.

11. The method of claim 10, wherein the plurality of symbol periods are specific to the at least one channel condition threshold.

12. The method of claim 10 further comprising:
    transmitting, in accordance with at least the time-interleaved transmission scheme, a plurality of pilot signals during a plurality of symbol periods.

13. The method of claim 12, wherein the time-interleaved transmission scheme comprises a decreased pilot signal density pattern.

14. The method of claim 10 further comprising:
    determining that one or more of a Doppler parameter associated with a channel, an interference level for a channel, or a fading parameter associated with a channel is above the at least one channel condition threshold, wherein the channel condition comprises one or more of the Doppler parameter, the interference level, or the fading parameter.

15. The method of claim 10 further comprising:
    receiving a message comprising a request for a time-interleaved transmission scheme for one or more blocks of encoded information.

16. An apparatus for wireless communication, in a system comprising:
    a processor;
    memory in electronic communication with the processor; and
    instructions stored in the memory and operable, when executed by the processor, to cause the apparatus to:
    determine, at a first wireless device, that a channel condition satisfies at least one channel condition threshold;
    transmit, based at least in part on the channel condition satisfying the at least one channel condition threshold, a message to a second wireless device, the message comprising a request to initiate a time-interleaved transmission scheme for one or more blocks of encoded information; and
    receive the one or more blocks of encoded information from the second wireless device in accordance with at least the time-interleaved transmission scheme.

17. The apparatus of claim 16, wherein the instructions are further executable by the processor to:
    receive, in accordance with at least the time-interleaved transmission scheme, different portions of the one or more blocks of encoded information during a plurality of symbol periods.

18. The apparatus of claim 16, wherein the instructions are further executable by the processor to:
    receive, in accordance with at least the time-interleaved transmission scheme, a plurality of pilot signals during a plurality of symbol periods.

19. The apparatus of claim 18, wherein the time-interleaved transmission scheme comprises a decreased pilot signal density pattern.

20. The apparatus of claim 18, wherein the instructions are further executable by the processor to:
    apply a channel estimation value to different portions of the one or more blocks of encoded information that are received during a plurality of different symbol periods.

21. The apparatus of claim 16, wherein the instructions are further executable by the processor to:
    determine that one or more of a Doppler parameter associated with a channel, an interference level for a channel, or a fading parameter associated with a channel is above the at least one channel condition threshold, wherein the channel condition comprises one or more of the Doppler parameter, the interference level, or the fading parameter.

22. The apparatus of claim 16, wherein the first wireless device is a user equipment (UE) and the second wireless device is a base station.

23. The apparatus of claim 16, wherein the first wireless device is a base station and the second wireless device is a user equipment (UE).

24. An apparatus for wireless communication, in a system comprising:
a processor;
memory in electronic communication with the processor; and
instructions stored in the memory and operable, when executed by the processor, to cause the apparatus to:
determine that a channel condition satisfies at least one channel condition threshold;
identify, based at least in part on the channel condition satisfying the at least one channel condition threshold, a time-interleaved transmission scheme for one or more blocks of encoded information; and
transmit different portions of the one or more blocks of encoded information during a plurality of symbol periods in accordance with at least the time-interleaved transmission scheme.

25. The apparatus of claim 24, wherein the instructions are further executable by the processor to:
transmit, in accordance with at least the time-interleaved transmission scheme, a plurality of pilot signals during a plurality of symbol periods.

26. The apparatus of claim 25, wherein:
the time-interleaved transmission scheme comprises a decreased pilot signal density pattern.

27. The apparatus of claim 24, wherein the instructions are further executable by the processor to:
determine that one or more of a Doppler parameter associated with a channel, an interference level for a channel, or a fading parameter associated with a channel is above the at least one channel condition threshold, wherein the channel condition comprises one or more of the Doppler parameter, the interference level, or the fading parameter.

28. The apparatus of claim 24, wherein the instructions are further executable by the processor to:
receive a message comprising a request for a time-interleaved transmission scheme for one or more blocks of encoded information.

* * * * *